(12) United States Patent
Gieseler et al.

(10) Patent No.: US 7,536,114 B2
(45) Date of Patent: May 19, 2009

(54) METHOD AND SYSTEM FOR CONVERTING AN OPTICAL RECEIVED PULSE TRAIN INTO AN ELECTRICAL OUTPUT PULSE TRAIN

(75) Inventors: Michael Gieseler, Dresden (DE); Manfred Sorst, Radebeul (DE)

(73) Assignee: Zentrum Mikroelektronik Dresden, AG, Dresden (DE)

( * ) Notice: Subject to any disclaimer, the term of this patent is extended or adjusted under 35 U.S.C. 154(b) by 0 days.

(21) Appl. No.: 11/405,023

(22) Filed: Apr. 14, 2006

(65) Prior Publication Data

US 2006/0251428 A1   Nov. 9, 2006

Related U.S. Application Data

(63) Continuation of application No. PCT/DE2004/001383, filed on Jul. 1, 2004.

(30) Foreign Application Priority Data

Oct. 17, 2003  (DE) ............... 103 49 130
Feb. 23, 2004  (DE) ............... 10 2004 009 037

(51) Int. Cl.
  *H04B 10/06*  (2006.01)
  *H04B 1/10*   (2006.01)
  *H04L 27/08*  (2006.01)
  *H03K 17/78*  (2006.01)

(52) U.S. Cl. .................. 398/210; 398/209; 375/345; 375/350; 250/214 AG; 250/214 B; 250/214 DC

(58) Field of Classification Search ......... 398/208–210; 375/345, 350; 250/214 AG, 214 B, 214 C, 250/214 DC See application file for complete search history.

(56) References Cited

U.S. PATENT DOCUMENTS 4,473,745 A    9/1984  Chown ................. 250/214

(Continued)

FOREIGN PATENT DOCUMENTS

EP    0 344 091    11/1989

*Primary Examiner*—Nathan M Curs
(74) *Attorney, Agent, or Firm*—Heslin Rothenberg Farley & Mesiti P.C.; Victor A. Cardona, Esq.

(57) ABSTRACT

The aim of the invention, which concerns a method and a system for converting an optical received pulse train into an electrical output pulse train, is to create a method and an associated circuit arrangement for converting an optical received pulse train into an electrical output pulse train whereby achieving an improvement in transmission quality and a reduction in latency time. According to the invention, the aim, with regard to the method, is achieved by virtue of the fact that: the current pulse train is converted in a controlled manner into a first voltage pulse train; the first voltage pulse train is converted into a second voltage pulse train by controllably limiting its amplitude; according to the amplitude of the second voltage pulse train, a third voltage pulse train, which is free from a static offset of the second voltage pulse train, is generated so that it is lower than a first amplitude quantity, and the third voltage pulse train, which is free from a dynamic offset, is generated so that it is greater than a second amplitude quantity that is greater than the first amplitude quantity; in the event of a packet pause, the amplitude of the third voltage pulse train is set to zero, and; the output pulse train is generated from the third voltage pulse train.

20 Claims, 16 Drawing Sheets

U.S. PATENT DOCUMENTS

| | | | |
|---|---|---|---|
| 5,508,836 A | 4/1996 | DeCaro et al. | 359/189 |
| 6,038,049 A * | 3/2000 | Shimizu et al. | 398/210 |
| 6,907,202 B1 * | 6/2005 | Ide et al. | 398/208 |
| 6,963,696 B1 * | 11/2005 | Bowler et al. | 398/202 |
| 7,231,152 B2 * | 6/2007 | Kim et al. | 398/208 |

* cited by examiner

Received pulse train

Output pulse train (Prior Art)

METHOD AND SYSTEM FOR CONVERTING AN OPTICAL RECEIVED PULSE TRAIN INTO AN ELECTRICAL OUTPUT PULSE TRAIN

CROSS REFERENCE TO RELATED APPLICATIONS

This application is a continuation of International Application No PCT/DE2004/001383 filed on Jul. 1, 2004, and published in German as International Publication WO 2005/046094 A1 on May 19, 2005 and claims priority of German Application No DE 103 49 130.9, filed Oct. 17, 2003and German Application No DE 10 2004 009 037.8, filed Feb. 23, 2004, the disclosures of which are incorporated by reference in their entirety.

This invention relates to a method for converting a received optical pulse train into an electric output pulse train, wherein the received optical pulse train has pulse packets and packet pauses and wherein the received optical pulse train is converted into a light-dependent current pulse train that is transformed into a voltage pulse train, whose amplitude is controlled and whose pulses are transformed into digital output pulses of the output pulse train.

The invention also relates to an assembly for implementing the method to convert a received optical pulse train into an electric output pulse train.

It is known in prior art that an infrared receiver is comprised of a bias voltage generator for the photodiode, a transimpedance amplifier for transforming the photocurrent into a voltage, and a comparator for forming a digital signal for further processing.

Such solutions use DC control loops to compensate for offsets occurring in circuits for processing differential signals as a result of asymmetries or to compensate for any existing DC light.

The control loop that is very slow when using a DC-coupled amplifier generates pole sites in the full transmission function that generate a higher-order polynomial (>2).

One principle of every infrared transmission, for example, according to the IrDa standard, is to transform only the light pulses sent. However, further pulses may also result from the higher-order system, particularly after long data transmissions, which are characterized by long pulse packets, from the asymmetrical signal character due to the method of data transmission or to the transmission protocol, and/or from high photocurrent.

The asymmetrical signal character is caused by the introduction of energy into the system by light pulses only. However, the return to the operating point is carried out as an intrinsic process with a system-specific time constant.

The control assembly described is, therefore, loaded with a rectified voltage that corresponds to the integral of the input signal as a function of the signal intensity and the duty cycle. This charge is cleared in the form of an amplifier overshooting and results in one or more additional pulses, the so-called 'satellites, after receiving a pulse packet and when there are no additional light pulses at the receiver's input.

A further drawback of the prior art is that after a high light intensity transmission the amplifier is unable to receive a signal of low intensity for a relatively long time. The result is the so-called latency time during which the system returns to its basic state.

The invention therefore has as its objective to provide a method and a corresponding circuit assembly for converting a received optical pulse train into an electric output pulse train that is designed to improve transmission quality and to reduce the latency time.

According to the invention, this objective is achieved by a method of the type mentioned above for converting a received optical pulse train into an electric output pulse train by transforming the current pulse train into a first voltage pulse train in a controlled manner and by then transforming that said first voltage pulse train into a second voltage pulse train through controllably limiting its amplitude. As a function of the amplitude of said second voltage pulse train, a third voltage pulse train is then generated below a first amplitude size that is free of a static offset of said second voltage pulse train. Above the aforementioned first amplitude size, the third voltage pulse train is free of said static offset only to a reduced degree, and above a second amplitude size larger than the aforementioned first amplitude size, said third voltage pulse train is generated free of a dynamic offset. Below this second amplitude size, said third voltage pulse train is free of said dynamic offset of said second voltage pulse train only to a reduced degree when a packet pause occurs, the amplitude of said third voltage pulse train is set to zero, and the output pulse train is generated from the third voltage pulse train.

The received pulse train, which reaches the receiver diode in the form of light pulses, consists of pulse packets and packet pauses. A pulse packet may include one or more single pulses, each consisting of a certain pulse duration and a certain pulse pause. As a result, if a pulse packet contains only one pulse, the pulse duration is identical to the pulse packet duration and the pulse pause is identical to the packet pause.

The optical input pulses received are converted into a light-dependent current pulse train and subsequently transformed into the first voltage pulse train by a transimpedance amplifier. This transformation involves the control of the amplification of the transimpedance amplifier. In a subsequent step, the first voltage pulse train produced is thus transformed into the second voltage pulse train, likewise involving amplification control. In both transformation processes, the purpose of the amplification control is to produce the second voltage pulse train with identical voltage amplitude for all occurring signal intensities.

The transformation of the second voltage pulse train into the third voltage pulse train is performed using different procedures and depends on the signal amplitude of the second voltage pulse train.

The third voltage pulse train is generated free of a static offset below a first amplitude size, that is, the undesired offset produced by transforming the pulse trains up to the second voltage pulse train is separated from the useful signal and thus no longer has any impact on the subsequent process steps, for example, on a downstream comparator, whose signal transformation is falsified by any offset at its input.

Above a second amplitude size, the third voltage pulse train is produced free of a dynamic offset, that is, the static offset produced by transforming the pulse trains up to the second voltage pulse train is not separated from the useful signal. A high-pass circuit performs this step, for example. In the transmission of a signal of asymmetrical signal character, an undesired integration of the mean values of the voltage pulse trains occurs at the high-pass output. To avoid this effect, herein referred to as dynamic offset, integration is eliminated for the voltage pulse trains above the second amplitude size.

The effect of the static offset separation decreases as the amplitude size of the second voltage pulse train increases in the area above the first amplitude size. Likewise, the effect of the dynamic offset reduction decreases below the second amplitude size as the amplitude of the second voltage pulse train decreases. This decrease may show a linear or a non-linear functional course.

The third voltage pulse train generated in these ways is set to zero when a packet pause occurs during signal transmission; that is, in order to improve the accuracy of subsequent steps, any error occurring in the signal amplitude is eliminated.

In the final step the third voltage pulse train is transformed into the output pulse train. In this process, for example, the signal conditions required for downstream steps are produced.

In one embodiment of the invention all electric pulse trains are differential signal pulse trains.

In the method according to the invention, the conversion of a received optical pulse train into an electric output pulse train can be carried out using both rectangular signals and differential signals.

In an additional embodiment of the invention for asymmetrical pulse trains of the second voltage pulse train a dynamic offset separation is carried out to produce the third voltage pulse train, and the second voltage pulse train is subjected to high-pass filtering using a capacitor. In each pulse pause, a discharge of the capacitor by an amount that is a function of the size of the amplitude of the second voltage pulse train is performed.

The transformation of the second voltage pulse train into the third voltage pulse train is performed using an assembly of a high-pass character. However, when transmitting signals of asymmetrical signal character, there will be an undesired up-integrating of the voltage pulse trains at a high-pass output. To avoid these dynamic offsets the process of integration is counteracted as per the invention. To this end, at least a partial discharge of the capacitor is effected during the pulse pauses. The amplitude of the second voltage pulse train determines the intensity of the discharge in direct proportionality.

In a special embodiment of the invention each pulse of the output pulse train starts a time comparison with a predefined time period, so that after the lapse of the predefined time period a "lock" signal is generated marking the end of a pulse packet.

The method according to the invention ensures continuous detection of a running data transmission and the end of the data transmission. To implement this detection, each pulse of the output pulse train starts a time comparison with a pre-defined time period. If, for example, the last pulse of an output pulse train packet has started the time comparison and no additional pulses arrive before the conclusion of the time comparison, then upon the end of the time comparison, a signal is generated that indicates the end of the current data transmission. If a further pulse arrives during the time comparison, the comparison process is reset and the time comparison starts again from the beginning.

In one embodiment of the invention the time period is shorter than a latency time and longer than the longest pulse pause.

For example, after a high light intensity data transmission, an amplifier of a converting unit is unable to properly process a signal of low signal intensity for a length of time that depends on the overall configuration. This period is the latency time, the definition of which determines the upper limit of the time range for the time period. When dimensioning the upper limit of the time period, the maximum pause time within the STR protocol of 115 kBit/s must also be considered.

The lower limit for the time period is defined by the pulse width of the slowest transmission mode to be supported. If a data transmission is conducted, for example, in the SIR protocol at 9.6 kBit/s, the maximum pulse width is 22 μs. Accordingly, the time period must be longer than these 22 μs in order to prevent a lock signal from being generated during a long pulse, i.e., before its termination.

In one embodiment of the invention a first "AGCSH" control voltage is generated as a function of the amplitude of the second voltage pulse train to control the amplitude of the first voltage pulse train that is generated in the transformation of the current pulse train into a voltage pulse train.

According to the invention, at least the transformation of the current pulse train into the first voltage pulse train is carried out so that it can be controlled. The "AGCSH" control voltage is generated as a graduated, i.e., analog voltage to avoid abrupt changes in the pulse position or pulse width and to prevent the formation of satellite pulses.

In one embodiment of the invention a second "zero" control voltage is generated as a function of the first "AGCSH" control voltage for setting the amplitude of the third voltage pulse train to zero when a packet pause occurs if the amplitude of the second voltage pulse train exceeds a first amplitude size and the lock signal is active.

Controlled by the "AGCSH" control voltage generated, the second "zero" control voltage is formed. The purpose of this control voltage is to set the amplitude of the third voltage pulse train to zero when a packet pause occurs, but the "zero" control signal is formed only if the amplitude of the second voltage pulse train exceeds a first amplitude size and the lock signal indicates the end of data transmission. Setting the amplitude of the third voltage pulse train to zero reduces the high-pass time constant and it also prevents any differential signal activation of a downstream assembly for generating the digital output pulse train when the differential signal technique is used.

In a special embodiment of the invention a third "limiter" control voltage is generated as a function of the first "AGCSH" control voltage and thus the amplitude of the second voltage pulse train is limited.

Aside from the controlled transformation of the current pulse train into the first voltage pulse train, the subsequent transformation of the first voltage pulse train into the second voltage pulse train is also carried out in a controlled manner. Ideally, this control is effected by the "limiter" control signal in such a way that the second voltage pulse train has an identical amplitude for all signal intensities. The "limiter" control voltage is generated as a function of the "AGCSH" control voltage, so that, for example, after reaching the minimum amplifying value of the "AGCSH" control voltage, control is continued for the further reduction of the amplitude by changing the "limiter" control voltage in order to avoid the interference of non-linear large signal effects occurring with large signals.

In another embodiment of the invention a fourth "short" control voltage is generated as a function of the first "AGCSH" control voltage and used to generate a third voltage pulse train that is free of the static or the dynamic offset.

The fourth "short" control voltage is also generated as a function of the size of the signal amplitude. This control voltage controls the generation of the third voltage pulse train that is generated free of any static offset when small signal amplitudes occur, that is, the constant component of the second voltage pulse train is eliminated.

The static offset separation is switched off using "short" for large signal amplitudes of the second voltage pulse train. Thus, for example, a reduction of the dominant pole sites from two to one is achieved, resulting in an improvement in the return behavior of the third voltage pulse train into the operating point following an oscillation.

In a further embodiment of the invention a fifth "level" control voltage is generated as a function of the first "AGCSH" control voltage and used to control the operating threshold and the hysteresis of a comparator during the transformation of the third voltage pulse train into the output pulse train.

Due to the optical transmission principle, the oscillation of an amplifier in the conversion unit occurs only in a positive direction through a "light on" process, wherein the return of the signal level is effected exclusively by means of the intrinsic process of the amplifier. Therefore, the comparator threshold position must be asymmetrical and positive relative to the differential zero point. To avoid any erroneous detection, "level" is used to adjust the operating threshold and the hysteresis of a comparator configuration generating the output pulse train According to the invention the purpose of an assembly of the above type for converting a received optical pulse train into an electric output pulse train is achieved by connecting the photodiode with each of its electrodes to the inputs of an transimpedance amplifier via a capacitor, connecting the output of the transimpedance amplifier to the input of a buffer amplifier, and the output of the buffer amplifier to the input of a comparator via a high-pass circuit. At the same time, the capacitor of the high-pass circuit is bridged by a controllable element, and the input of an amplifier control assembly controlling the amplification of the transimpedance amplifier is connected to the output of the buffer amplifier, and the output of the amplifier control configuration is connected to a control signal input of the transimpedance amplifier.

A photodiode receiving the optical input pulses is connected to an assembly for bias voltage generation. This assembly is used to achieve a negative bias voltage of the photodiode.

The anode and the cathode of the photodiode are each also connected via capacitors to the inputs of a transimpedance amplifier. The capacitors perform the separation of the DC light or DC current component of the input signal prior to the current/voltage conversion in the transimpedance amplifier, thus providing the first voltage pulse train.

The output of the transimpedance amplifier is connected to the input of a buffer amplifier that transforms the first voltage pulse train into the second with a predetermined amplification V and provides it at its output.

The output of the buffer amplifier is connected to the input of a downstream high-pass circuit. According to the invention, this high-pass circuit has the special feature of bridging the capacitor of the high-pass circuit with a controllable element. For example, this controllable element may be a transistor that allows the capacitor of the high-pass to become effective in the signal path for the separation of the direct voltage or neutralizes its function. Due to the characteristic curve of the transistor and a corresponding activation, further states are possible between these two extreme states. The high-pass circuit converts the second voltage pulse train into the third voltage pulse train.

The output of the high-pass circuit is connected to the input of a comparator that converts the third voltage pulse train into the output pulse train and provides it at the output pulse train output.

For the controlled conversion of the pulses, an amplifying control assembly is connected at its input to the output of the buffer amplifier and at the output to the AGC input of the transimpedance amplifier. The amplifying control assembly controls the amplitude of the first voltage pulse train for the purpose of keeping the amplitude constant for varying received light intensities.

In another embodiment of the invention connections between the transimpedance amplifier and buffer amplifier, the buffer amplifier and high-pass circuit, and high-pass circuit and comparator assemblies consist of two signal paths for transmitting differential signals.

The assembly according to the invention can be adapted for processing rectangular pulses or, by appropriately designing the assemblies, for processing differential signals.

In a further embodiment of the invention the high-pass circuit has two inputs, an input IN connected to a first contact of a first capacitor and an input IP connected to a first contact of a second capacitor. At the same time, a second contact of the first capacitor is connected to an output ON, and a second contact of the second capacitor is connected to an output OP of the high-pass circuit. In this same embodiment, a first voltage divider is provided at the input, and a second voltage divider is provided at the output, whose center taps are each connected to each other. The first and the second capacitors are each bridged by a source-drain structure of a MOS-FET as the respective controllable element, the gate contacts of the two transistors are connected to an input "short," and the outputs ON and OP are each connected to a contact of a source-drain structure of a third MOS-FET whose gate contact is connected to the "zero" input.

For processing signals by means of the differential signal technique, the high-pass circuit according to the invention consists of two symmetrical high-pass circuits, each of which has one capacitor connected to an input and the output of the assembly and a resistor. The two resistors are connected and positioned between the outputs of the high-pass circuit and have a first center tap. The circuit further consists of a voltage divider at the input, consisting of two resistors. This divider is positioned between the two inputs of the circuit and has a second center tap. The first and the second center taps are connected to each other. According to the invention, a voltage means of the upstream buffer amplifier is introduced at the second center tap, so that the voltage is superimposed on the signal at the output of the high-pass circuit via the voltage divider at the output by means of the connection of the center taps, without the assembly interfering with the effect of the offset separation for the differential signal. This transfer of the buffer operation point to the input of the comparator constitutes an efficient way of generating the operation point for the comparator input.

The two high-pass capacitors are each bridged with a source-drain structure of a MOS-FET, which may be, for example, a p-channel transistor, whose gates are connected to the "short" control signal, for example, for bridging the high-pass capacitor in the event of high input signal intensities, which leads to a pole reduction of the entire system.

Another MOS-FET with a source-drain structure is positioned between both outputs ON and OP of the high-pass circuit. Its gate contact is connected to the "zero" control signal. This control signal allows, for example, the reduction of the output signal to zero for a predetermined time upon detection of the end of a transmission. Thus, the downstream comparator cannot detect erroneous pulses. At the same time, this reduces the time constant of the high pass, thus allowing a fast recharge of the static offset of the upstream buffer amplifier output to the high-pass capacitors.

In a further embodiment of the invention an output of the comparator is connected to the input of an interlocking logic that signals a pulse packet end, and a first output ("time") of the interlocking logic is connected to a second input ("time") of the amplifying control assembly.

An output of the comparator providing the output pulse train is connected to the "comp" input of an interlocking logic. The purpose of this interlocking logic is to detect the end of a current data transmission and to generate a "time" output signal indicating the end. For this purpose, the assembly includes a timer that carries out a time comparison with a predefined time period. The timer is restarted after each detected and provided output signal such that the "time" output signal is provided only after the time comparison following upon an at least preliminarily final output pulse. The "time" output of the interlocking logic is connected to a downstream input of the amplifying control assembly. This signal makes it possible to selectively influence the amplification control, for example, to accelerate the upward-regulation of amplification in the packet pauses for the purpose of reducing the system's latency time.

In a further embodiment of the invention a second output ("lock") of the interlocking logic is connected to a first input ("lock") of an end control assembly, a second input ("AGCSH") of the end control assembly is connected to the output of the amplifying control assembly, and a first output ("zero") of the end control assembly is connected to the "zero" input of the high-pass circuit.

A further output signal of the interlocking logic is the "lock" output signal. This output signal is generated by combining the output pulse train of the comparator with the "time" signal and is provided at the lock output. This signal also serves the detection of the end of a data transmission. The "lock" output of the interlocking logic is connected to the "lock" input of the end control assembly according to the invention. That assembly's "AGCSH" input is connected to the "AGCSH" output of the amplifying control assembly. By means of this arrangement and also by using combinatorics, the "zero" output signal for the high-pass circuit is generated and is provided at the "zero" output of the assembly. The "AGCSH" signal supplied by the amplifying control assembly is compared with a set point using a comparator. Upon detection of the transmission end, the "zero" signal is supplied to the high-pass circuit for the end processing described above. At the same time, the current amplitude value of the "AGCSH" voltage is compared with the set point value, and once the latter is reached, the logical status of the "zero" signal is changed, and thus the running end processing is terminated.

In a further embodiment of the invention a second output ("intense") of the end control assembly is connected to a third input ("intense") of the amplifying control assembly.

A further output signal generated by the end control assembly is the "intense" signal. This signal supplies information on the status of the comparison of the "AGCSH" voltage with the set point performed in the assembly. Connecting this signal output with the "intense" input of the amplifying control assembly in conjunction with the "time" signal allows for the start of the end processing in the amplifying control assembly following the detection of the end of the data transmission and for its selective completion after the set point of the comparator in the end control assembly has been reached. Thus, it becomes possible to reduce the assembly's latency time.

The invention is described in further detail with reference to an exemplary embodiment in the accompanying drawings.

Figure 3:
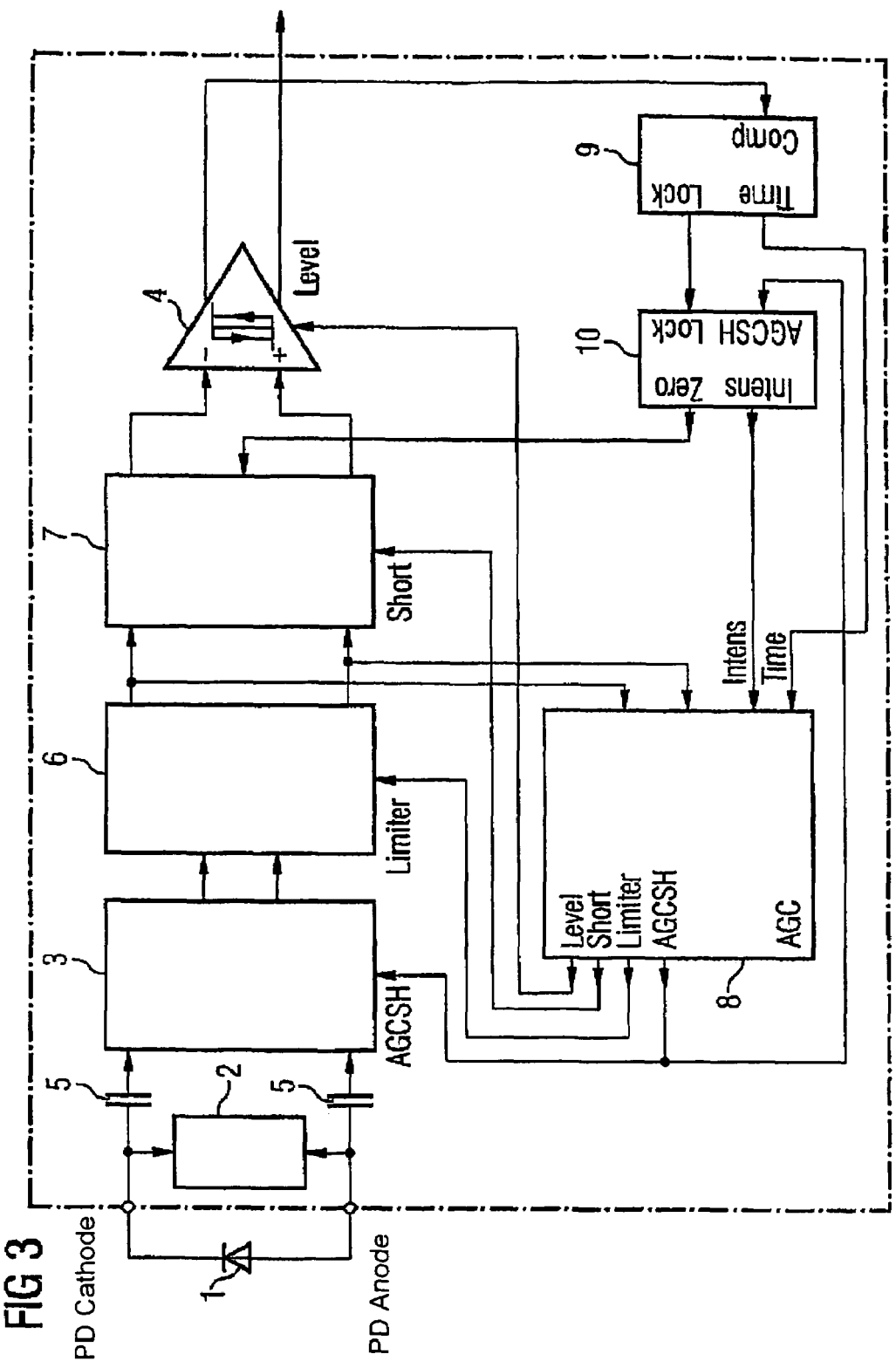
Figure 4:
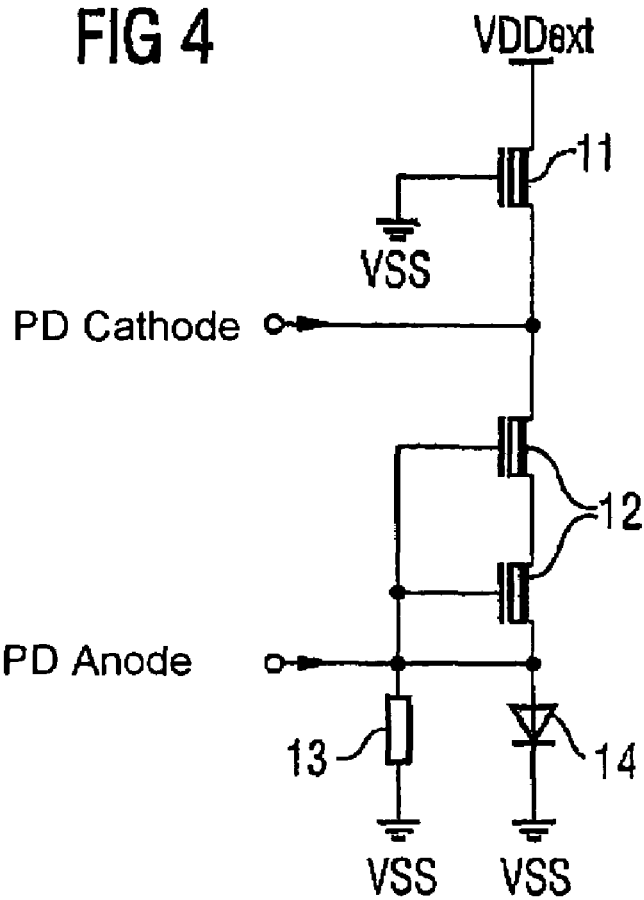
Figure 5:
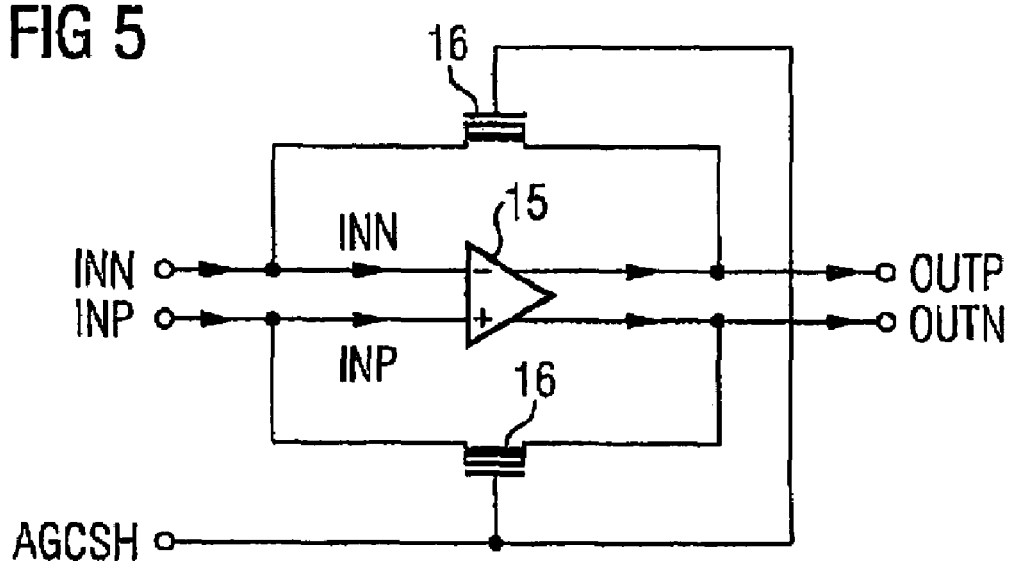
Figure 6:
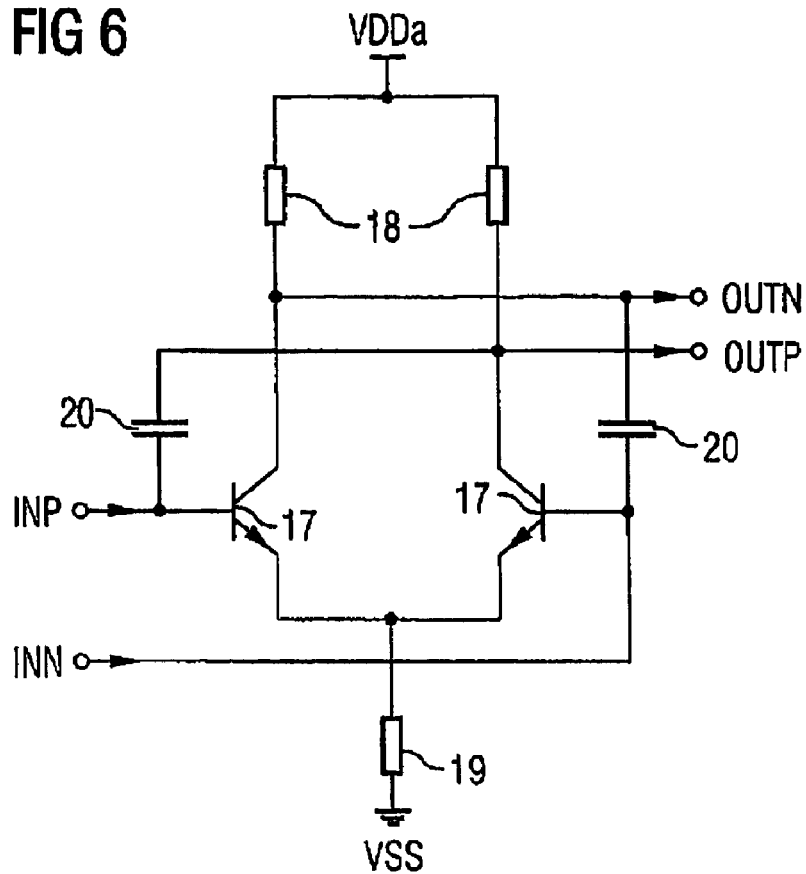
Figure 7:
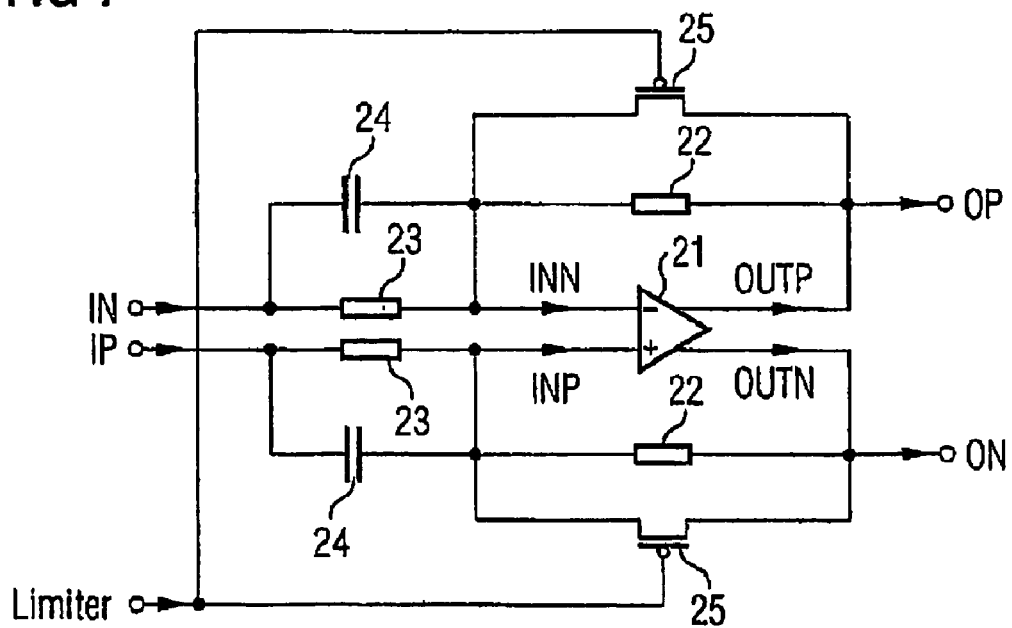
Figure 8:
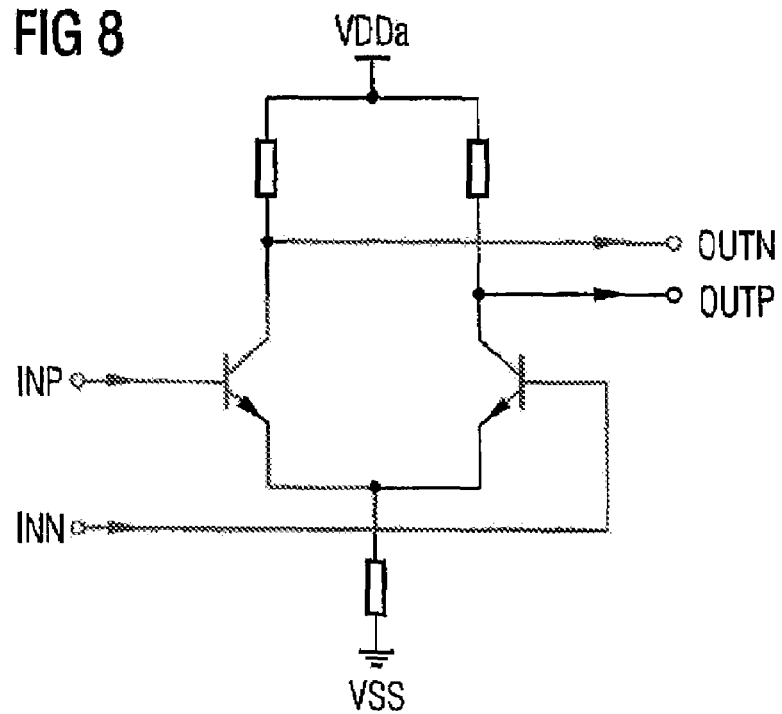
Figure 9:
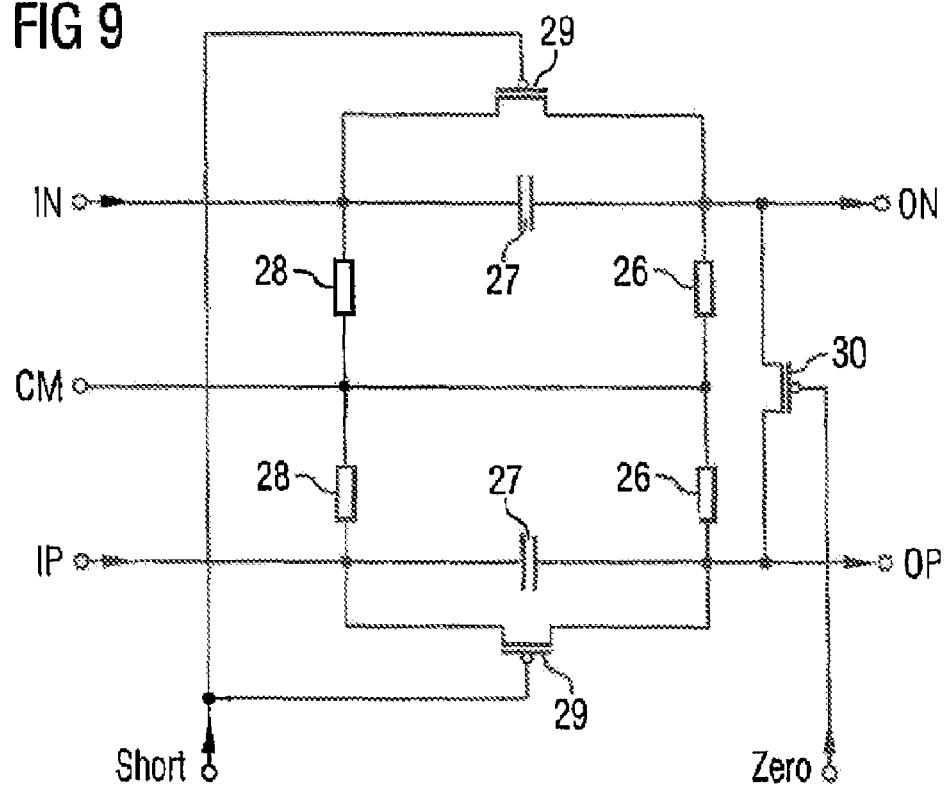
Figure 10:
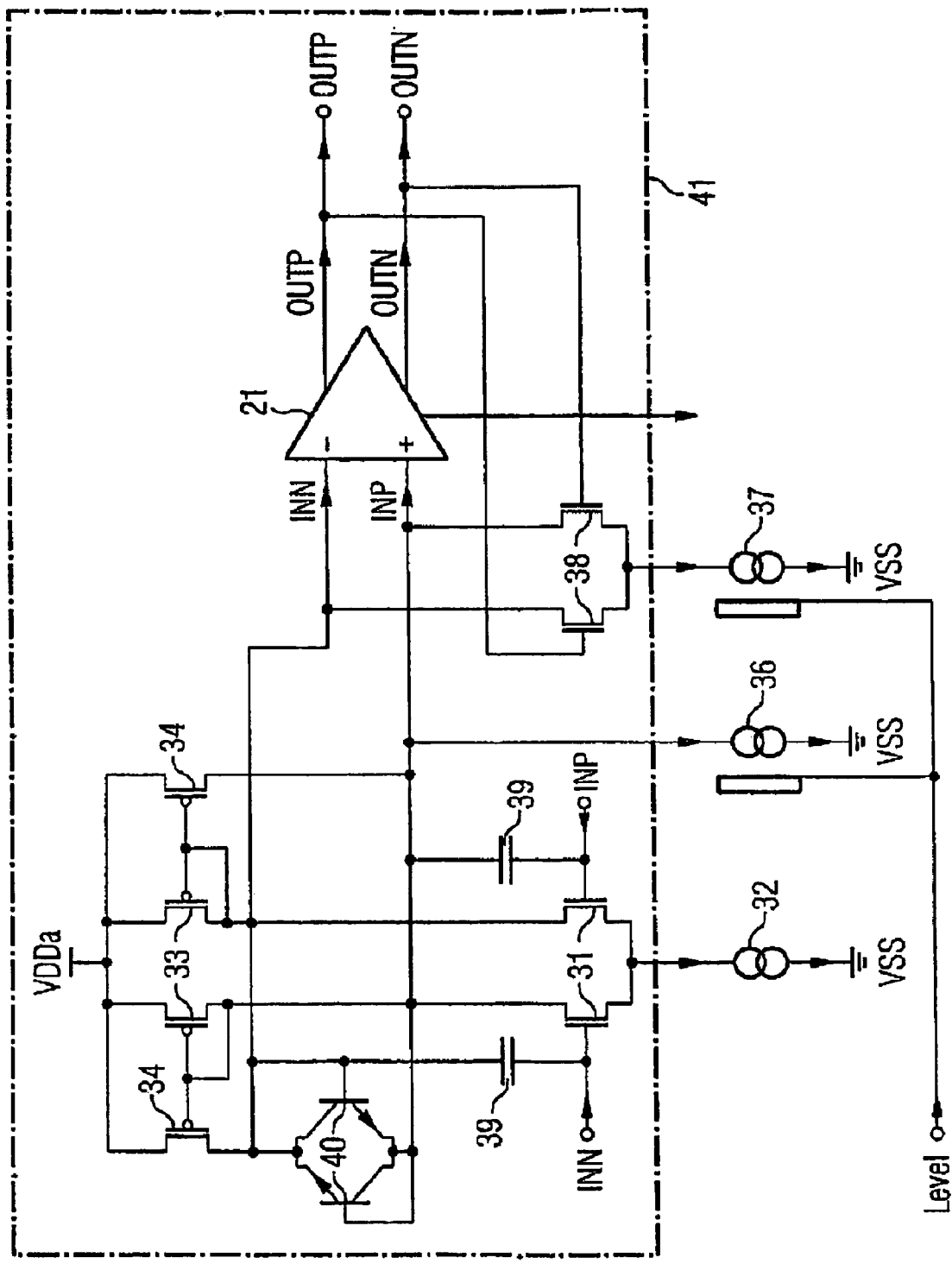
Figure 11:
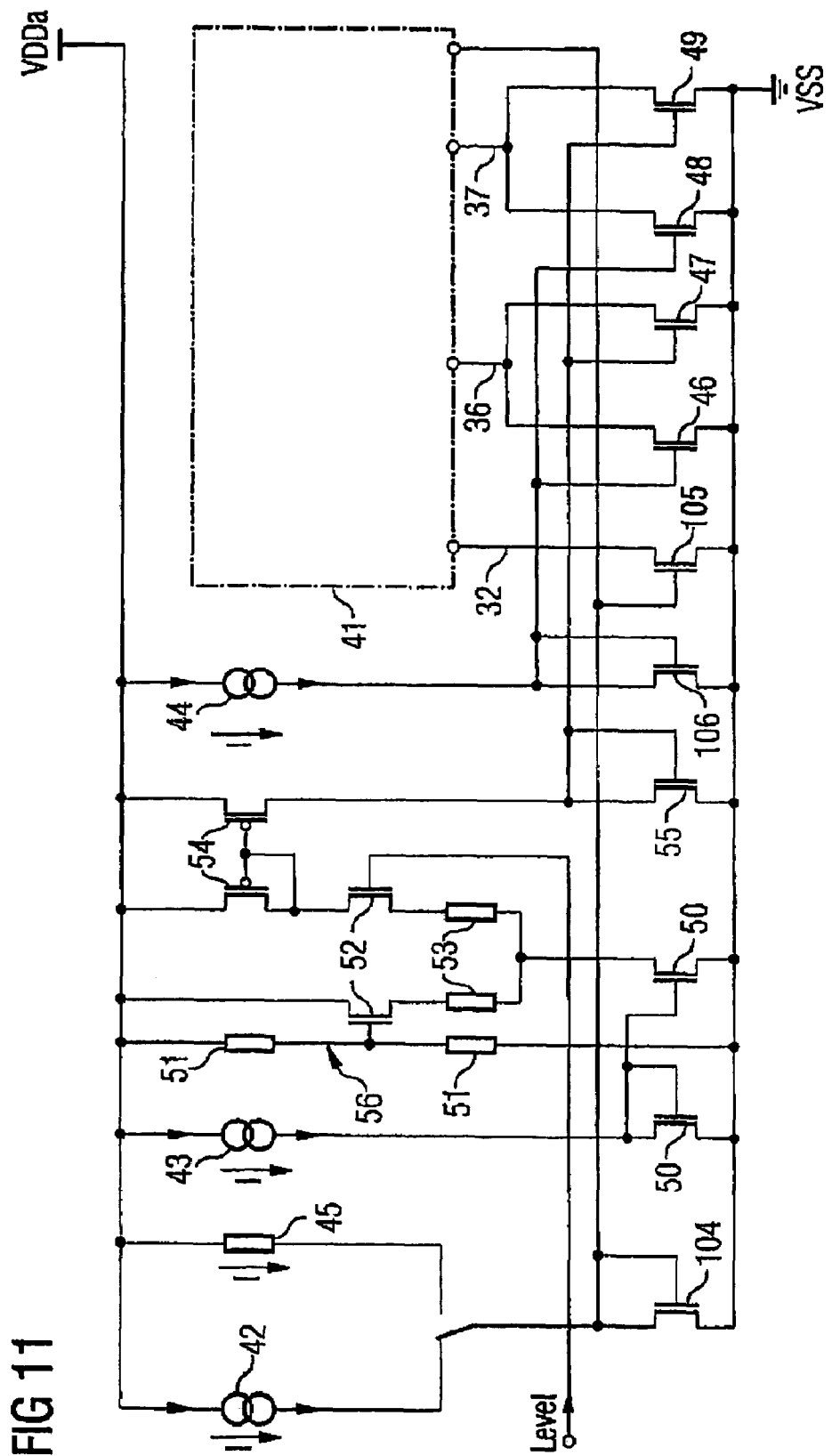
Figure 12:
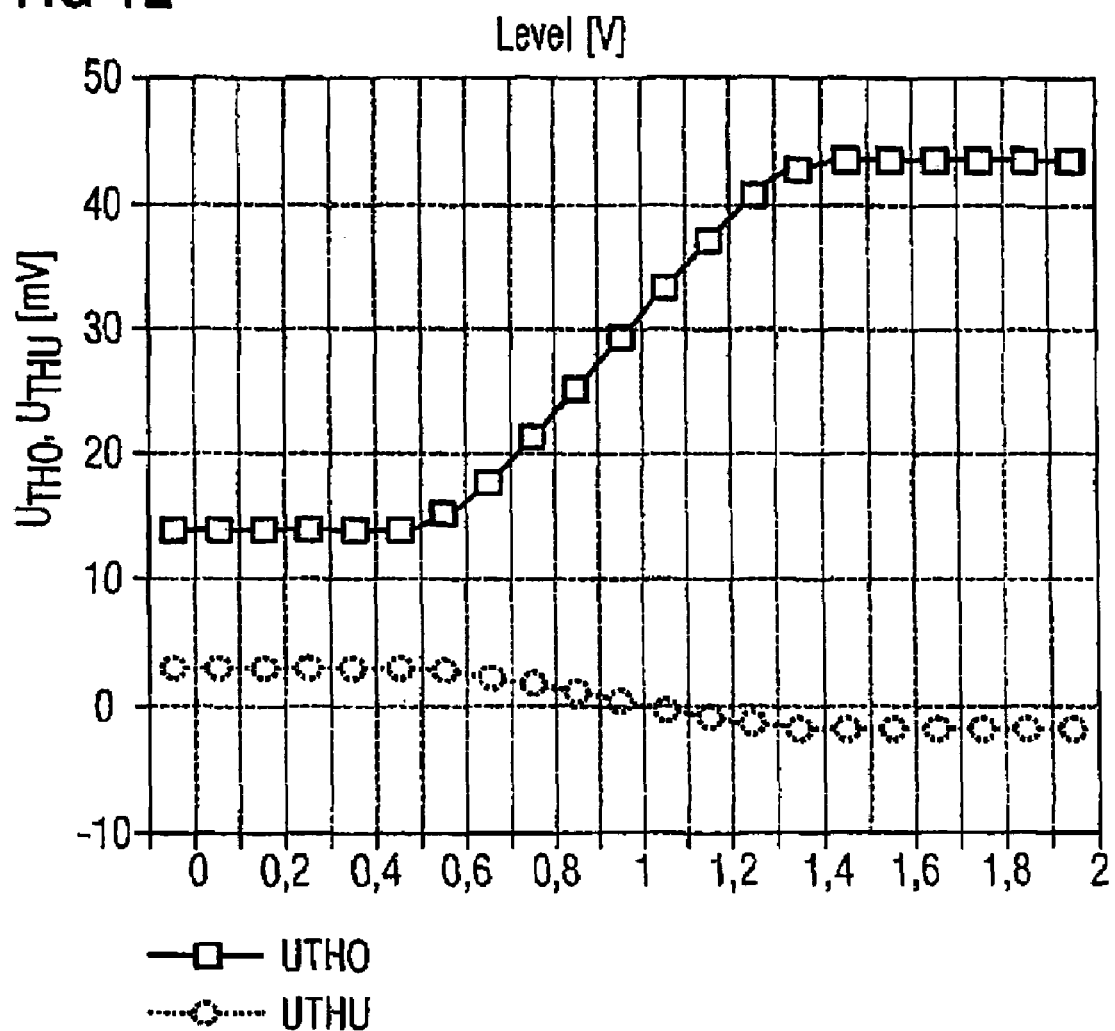
Figure 13:
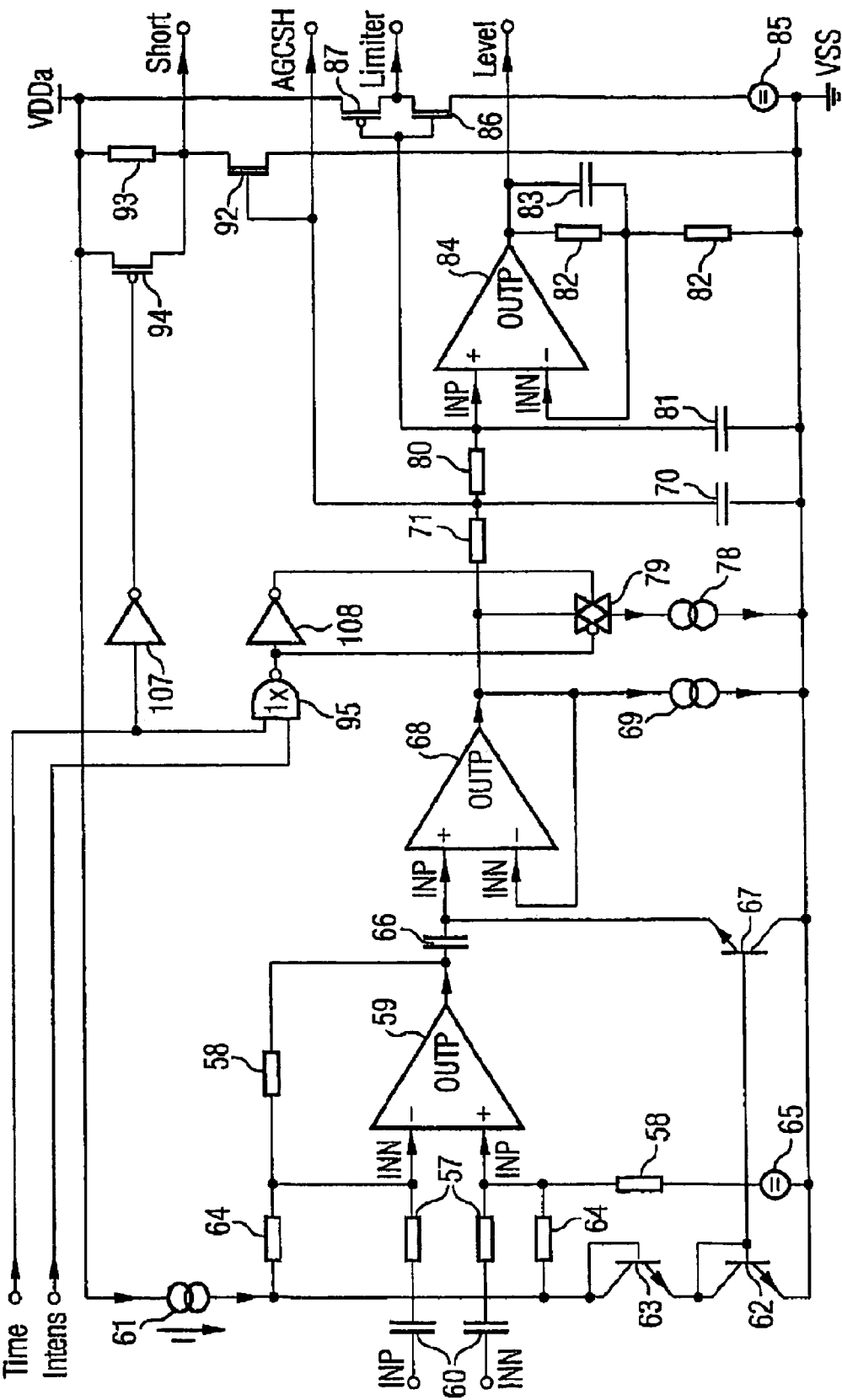
Figure 14:
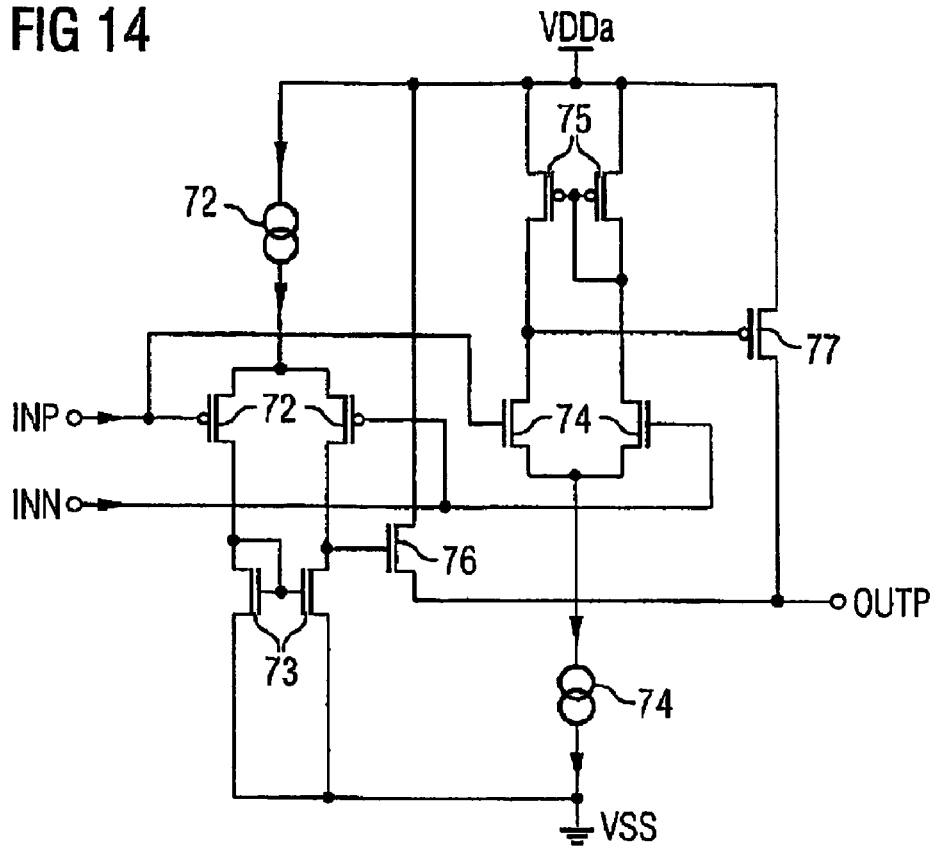
Figure 15:
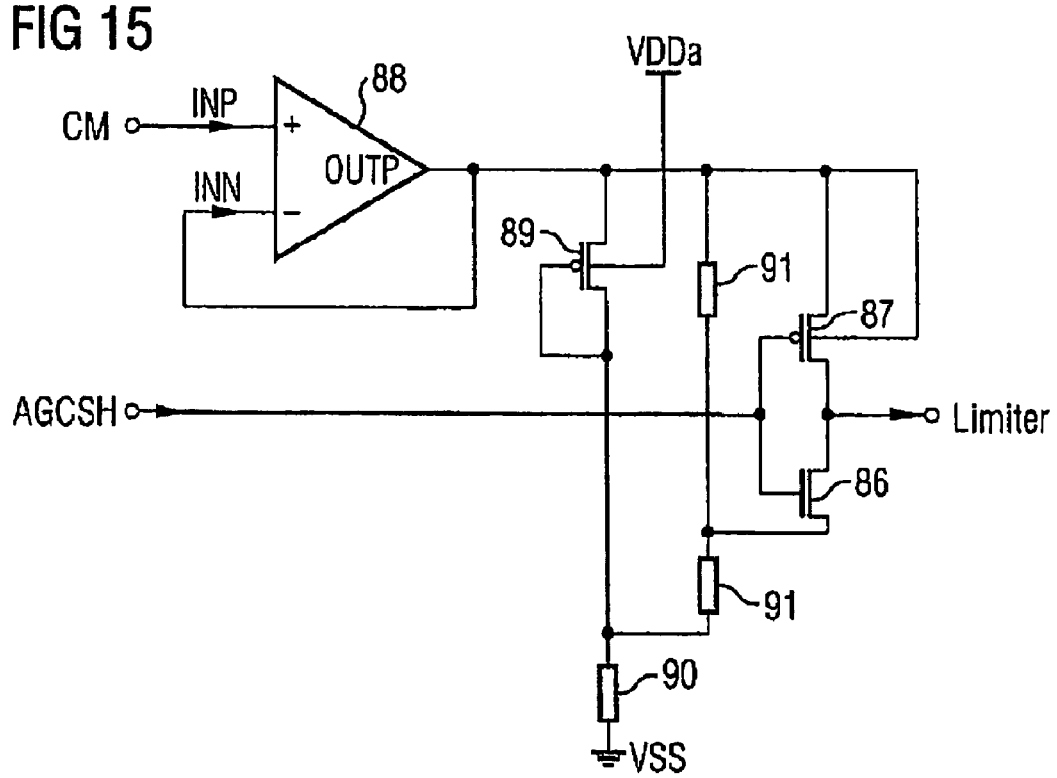
Figure 16:
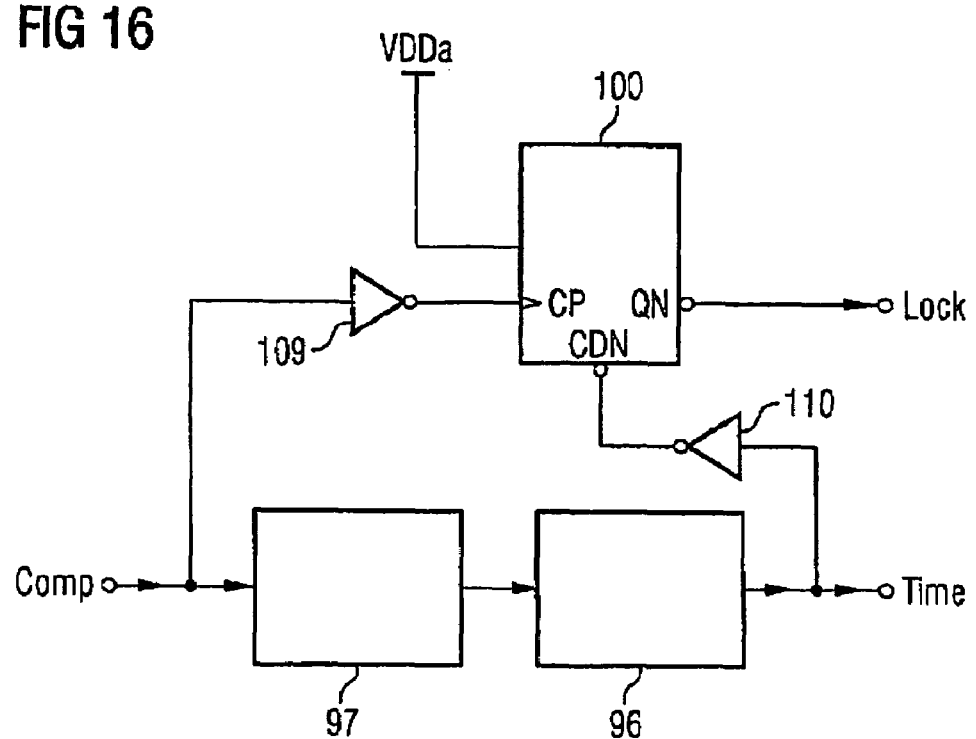
Figure 17:
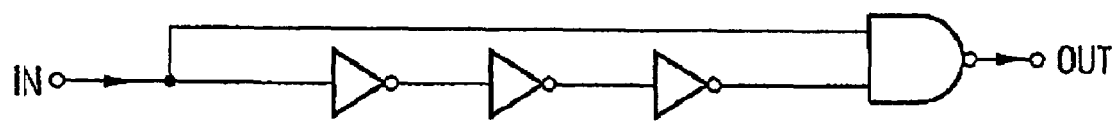
Figure 18:
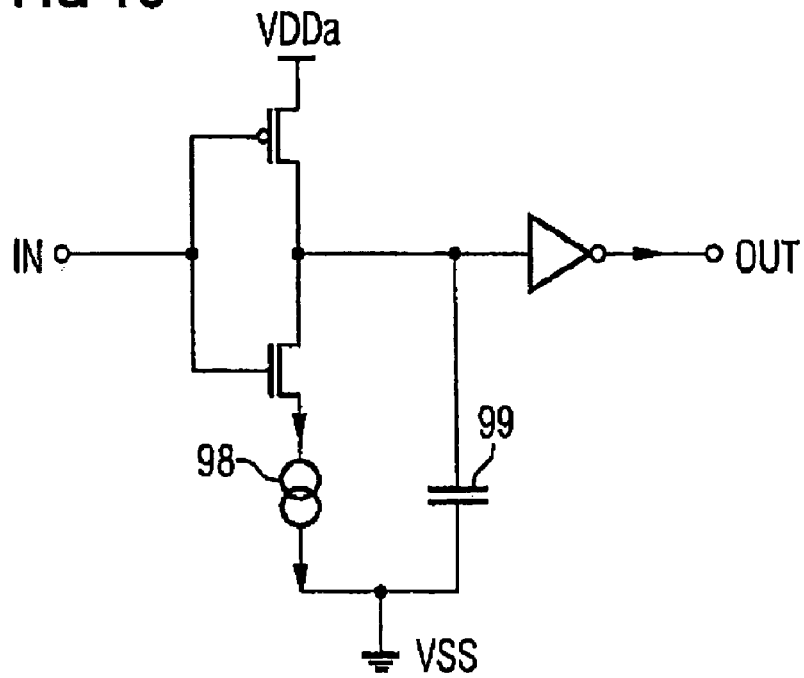
Figure 19:
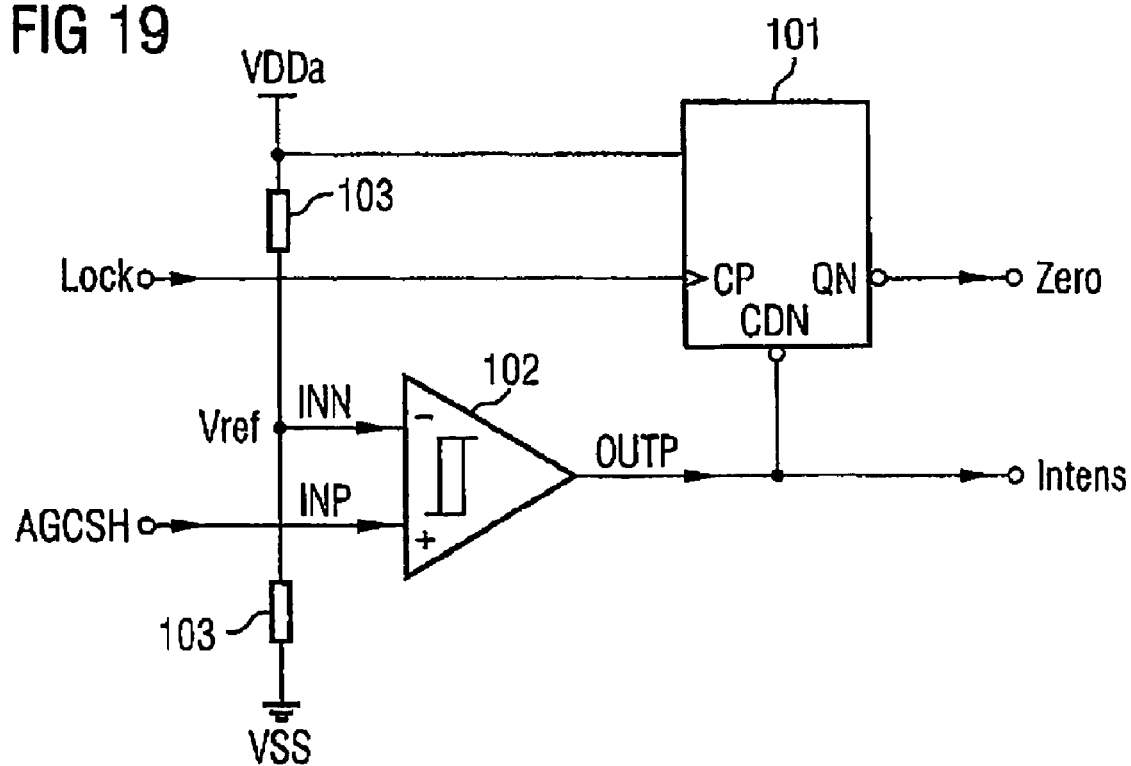
Figure 20:
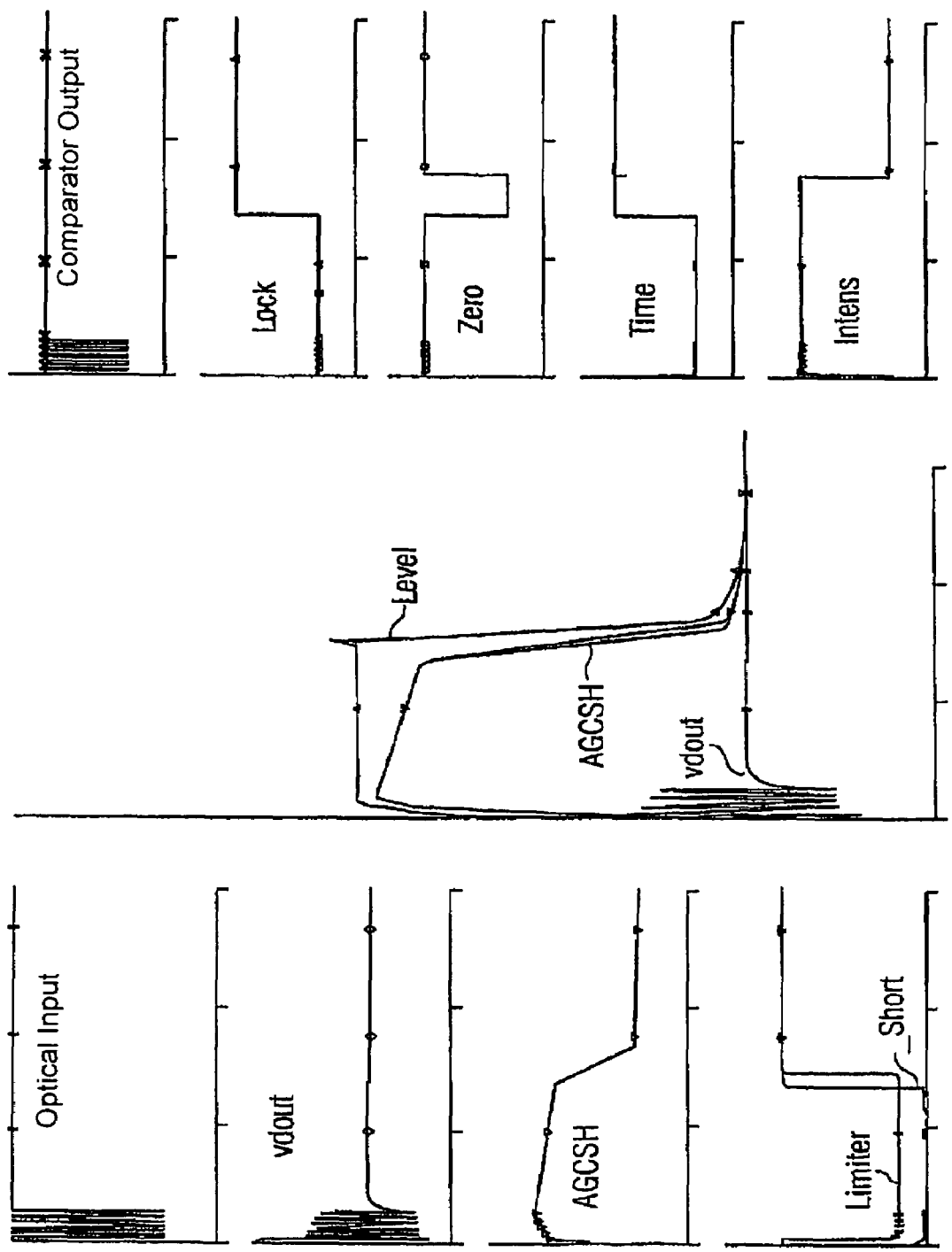
Figure 21:
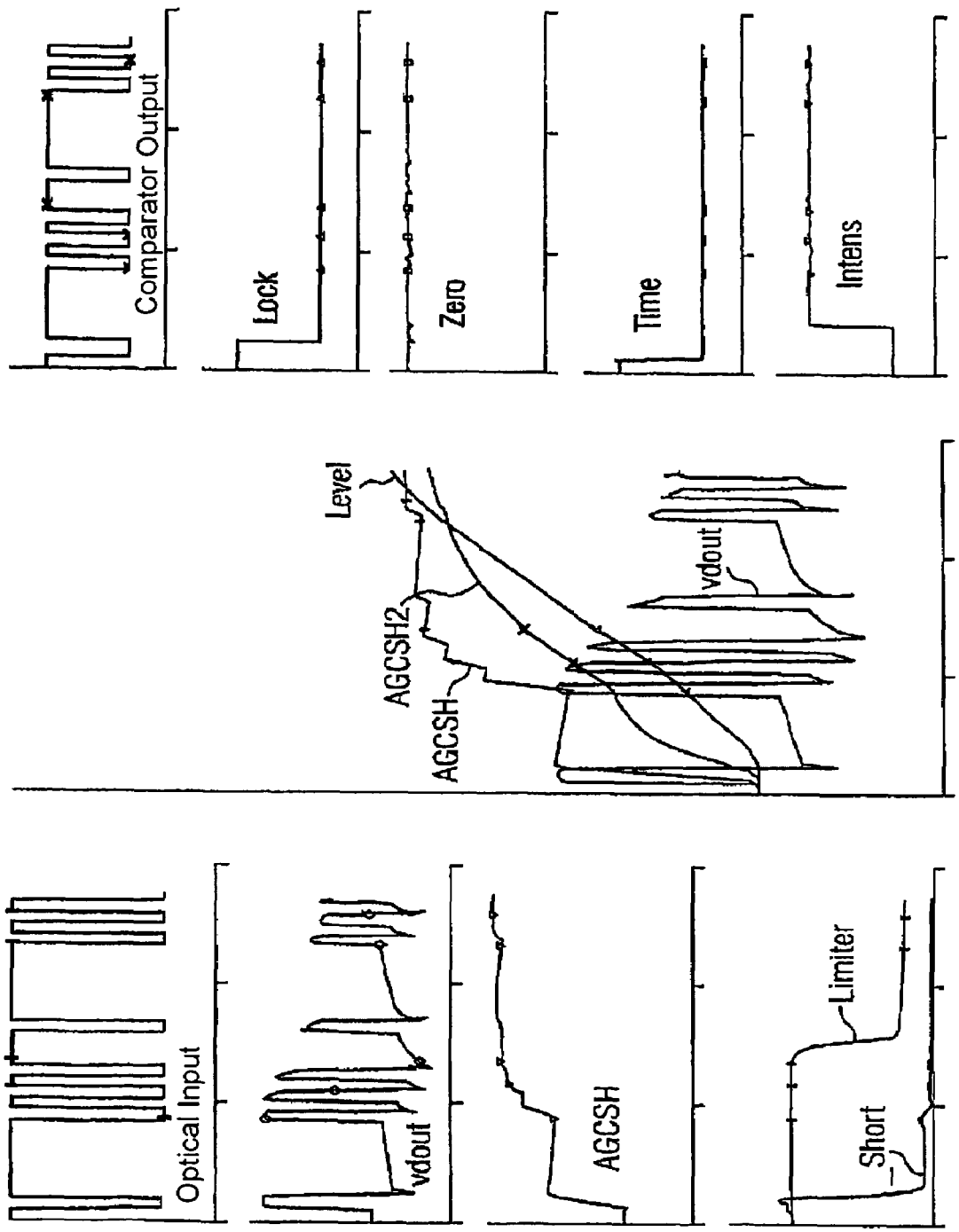
Figure 22:

FIG. 3 shows a more detailed receiver assembly according to the invention for processing differential signals, FIG. 4 shows a photodiode bias circuit FIG. 5 shows a transimpedance amplifier assembly FIG. 6 shows an exemplary implementation of the operation amplifier in the transimpedance amplifier, FIG. 7 shows a buffer amplifier assembly according to the invention, FIG. 8 shows an exemplary implementation of the operation amplifier in the buffer amplifier, FIG. 9 shows a controllable high-pass assembly according to the invention with controllable elements, FIG. 10 shows a comparator assembly according to the invention, FIG. 11 shows a control circuit assembly for the comparator for influencing the operating threshold and the hysteresis of the comparator, FIG. 12 is a graphic representation of the adjustment of the lower and the upper comparator operating thresholds, FIG. 13 shows an amplifying control assembly according to the invention FIG. 14 shows a rail-to-rail amplifier assembly for the amplifying control assembly, FIG. 15 shows an assembly for generating an adaptive voltage for the amplifying control assembly, FIG. 16 shows an interlocking logic assembly, FIG. 17 shows a digital differentiating circuit, FIG. 18 shows a timer circuit, FIG. 19 shows an end control assembly, FIG. 20 shows diagrams of a typical path of the signal using the example of receiving three FIR preambles and the start flag, FIG. 21 shows diagrams of a typical path of the signal at the start of a signal transmission in the FIR mode, and FIG. 22 shows diagrams of a typical path of the signal at the end of a FIR signal transmission.

Figure 1:
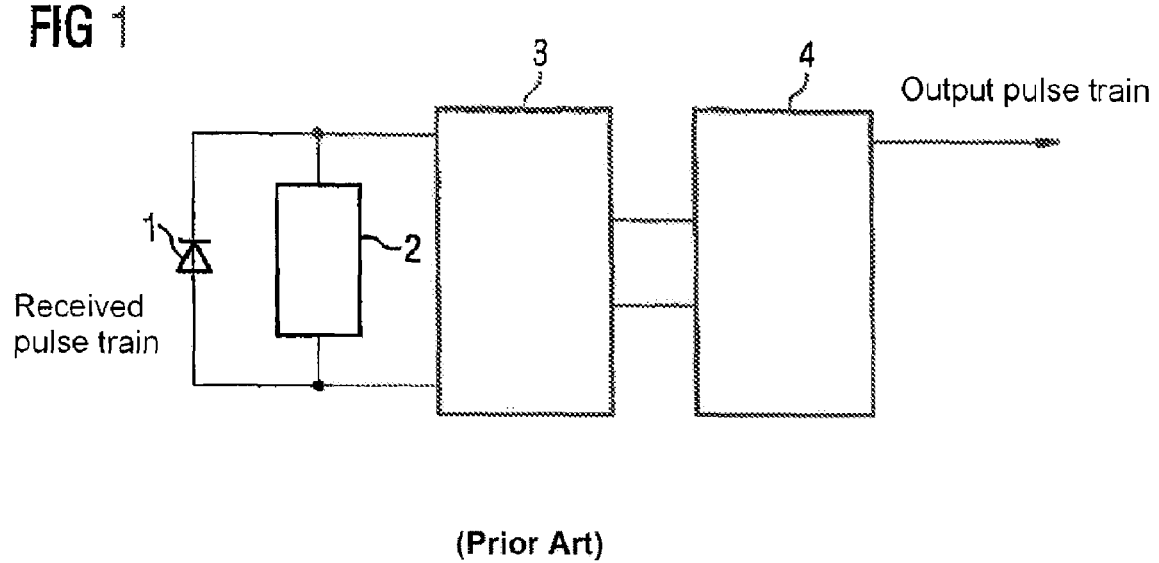
FIG. 1 shows a receiver assembly of prior art.

FIG. 1 shows an assembly for converting a received optical pulse train into an electric output pulse train of prior art. This assembly consists of the photodiode 1 receiving the light pulses, a bias voltage generator 2 for the photodiode 1, a downstream transimpedance amplifier 3, and a comparator 4 for generating the output pulse train.

Figure 2:
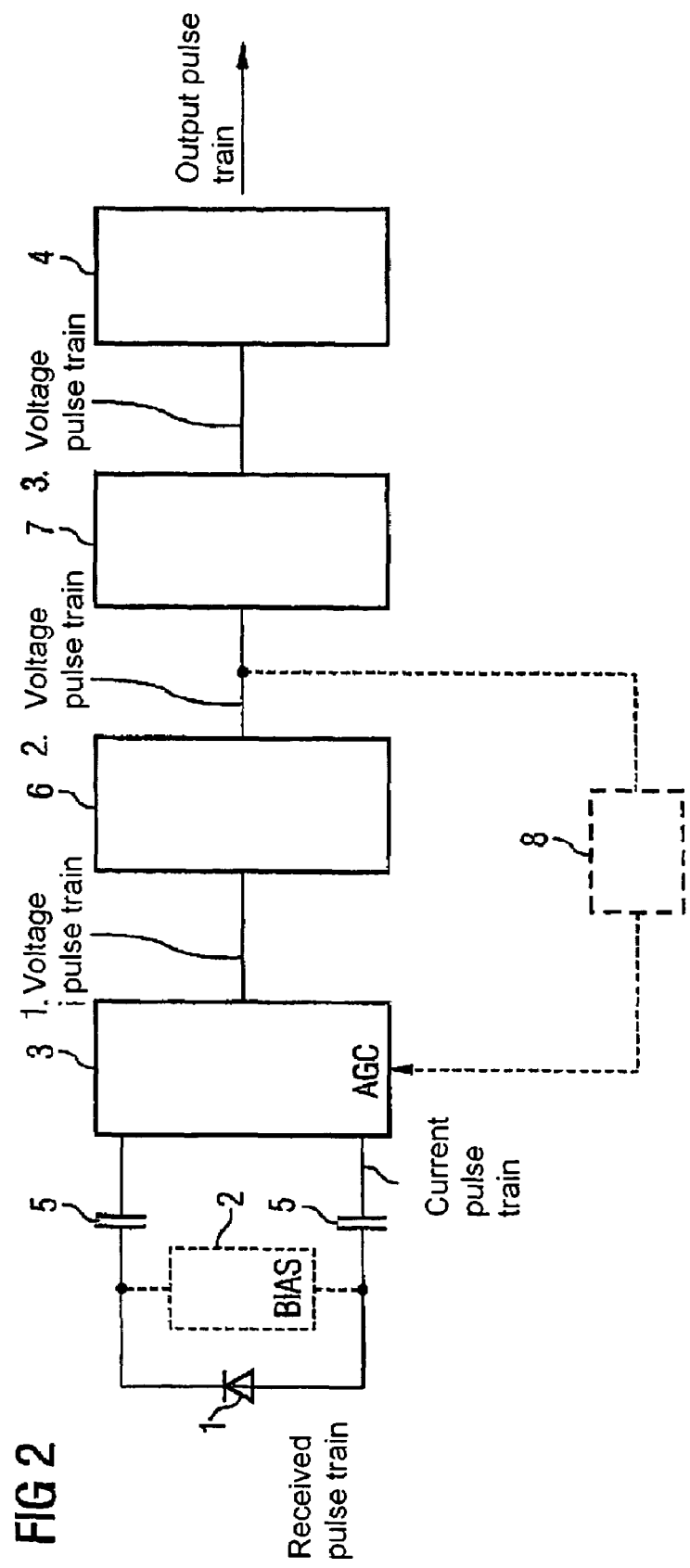
FIG. 2 shows a general receiver assembly according to the invention.

The conversion assembly according to the invention is shown in FIG. 2. This assembly consists of the photodiode 1 that is connected to the bias voltage generator 2, with all electrodes of the photodiode 1 connected to the inputs of the transimpedance amplifier 3 via a capacitor 5. The output of the transimpedance amplifier 3 is connected to the input of the downstream buffer amplifier 6. The output of the buffer amplifier 6 is connected to the high-pass circuit 7 according to the invention, and the output of the high-pass circuit 7 is connected to the input of the comparator 4. The comparator 4 has an output for providing the output pulse train. To control the amplification of the transimpedance amplifier 3, the latter has a control signal input ("AGCSH") that is connected to the output of an amplifying control assembly 8. The input of the amplifying control assembly 8 is connected, for example, to the output of a buffer amplifier 6. Further regulators or controls, for example, of the buffer amplifier 6, of the high-pass circuit 7, and of the comparator 4, are provided in particularly advantageous embodiments of the assembly.

The method according to the invention will be discussed with reference to a specific embodiment of the assembly for converting the received optical pulses into electric output pulses for processing differential signals as shown in FIG. 3.

The signal path starts at the bias voltage generator 2, which generates the negative bias voltage of a photodiode receiving optical pulses, for example, in accordance with IrDA protocol.

Subsequently, high-pass capacitors 5 separate the continuous light and DC current components at the input of the transimpedance amplifier 3. The latter operates as a current-voltage converter and converts the light-dependent current pulse train generated by the photodiode 1 into the first voltage pulse train. Transimpedance conductances for converting the photocurrent signal of the photodiode are provided, for example, in the form of depletion transistors whose conductance can be changed at the gate by means pf voltage control.

Following in the signal path, the buffer amplifier 6 with a predetermined amplification 'V' is coupled with the transimpedance amplifier 3 by direct voltage. Thus, in addition to the pulsed signal voltage of the second voltage pulse train, an offset direct voltage is also present at the output of the buffer amplifier 6.

To minimize the static offset voltage and its temperature course, both the transimpedance amplifier 3 and the buffer amplifier 6 are embodied as bipolar differential amplifier stages.

The high-pass circuit 7 according to the invention is positioned between the buffer amplifier 6 carrying the offset voltage and the comparator 4. This high-pass circuit is incorporated into the total circuit assembly in such a way that for small signal amplitudes of the second voltage pulse train that are below a first amplitude size, an offset separation is performed using the symmetrical high-pass assembly implemented in the high-pass circuit 7. The offset separation is also necessary to permit offset values of the transimpedance amplifier 3 in connection with the buffer amplifier 6 that are within the range of the operating threshold of the comparator 4.

Thus, for small input signals, the dominant poles of both high passes, i.e., those of the continuous light separation high pass defined by the capacitors 5 and those of the capacitors arranged in the high-pass circuit 7 itself, are tolerated. This is possible because the pauses of every IrDA protocol are sufficient for returning the differential output voltage of the high-pass circuit 7 to the setting zero point.

In contrast to this, with large input signal amplitudes of the second voltage pulse train that exceed a second amplitude size, the output differential voltage of the buffer amplifier 6 being significantly above the offset voltage, the symmetrical high pass incorporated into the high-pass circuit 7 is made ineffective by the fourth control voltage "short." In this way, the dominant poles are reduced from originally two to one. This reduction is advantageous because any approximation to the setting zero point of the differential output voltage of the high-pass circuit 7 has an asymptotical effect.

At the end of each pulse packet with large input signal amplitudes, a further intervention into the high-pass circuit 7 by means of the second "zero" control voltage provides the capability of recharging the high-pass capacitors discharged by the fourth "short" control voltage back to the level of the offset output voltage of the buffer amplifier 6 within a short time. For this purpose, the differential output voltage of the high-pass circuit 7 is bridged to zero for a certain time following the end of a pulse packet. Two effects are achieved in this manner. First, an extreme reduction of the high-pass time constant is achieved by which the offset of the buffer amplifier 6 is transferred directly to the high-pass capacitors of the high-pass circuit 7, and, second, any differential signal activation of the comparator 4 is avoided.

In the area between the first and the second amplitude sizes it is likewise desirable to prevent an activation of the comparator 4 after the end of a pulse packet by means of the second "zero" control voltage. In the case of very small input signals that are below the first amplitude size, the second "zero" control voltage is not active, since interferences can be coupled in by the parasitic elements of the MOS-FET that bridges the differential output voltage of the high-pass circuit 7 to zero.

For efficiency reasons, the output-side common-mode operating points of both outputs of the buffer amplifier 6 are therefore averaged and transmitted to the comparator 4 as the input-side operating point.

A comparator 4 connected to the output of the high-pass circuit 7 detects the voltage pulse train and converts it into the digital output pulse train. Due to the manner of activation of the amplifying assembly as well as of processing signals in accordance with the differential principle where an oscillation of the amplifier is effected by the "light on" status exclusively in a positive direction and the return into the operating point is effected only by the intrinsic process of the amplifier, the comparator operating threshold of the comparator 4 must be located asymmetrically positively relative to the differential zero point of the voltage. The comparator 4 has a "level" control channel that is used according to the invention to control the operating point and the hysteresis of the comparator 4 by means of the "level" control voltage in order to avoid erroneous detections depending on the signal intensity.

The IrDA standard provides for infrared signals to be transmitted in a very high dynamics range. The equivalent electric currents generated by the receiving photodiode are within the range of about 50 nA to above 10 mA.

This corresponds to a dynamics range of more than 5 powers of ten.

For the conversion assembly to be able to transmit all occurring signal currents converted into voltage pulse trains in accordance with the IrDA and according to the protocols defined for the respective speed range, and to convert them into a digital voltage pulse train of specified characteristics regarding pulse duration and pulse position, amplifying control is provided and, to avoid overdrive effects—if the available control range of the transimpedance amplifier 3 cannot prevent them—, limitation of the signal.

An amplifying control assembly 8 that derives its input information from the signal path carries out the amplitude control of the voltage pulse trains. For this purpose, in the assembly according to the invention as shown in FIG. 3, the output of the buffer amplifier 6 is connected to the first input of the amplifying control assembly 8. The first output of the amplifying control assembly 8 supplying the first control voltage is connected to the "AGCSH" control signal input of the transimpedance amplifier 3, and the second output of the amplifying control assembly 8 supplying the third control voltage is connected to the "limiter" control signal input of the buffer amplifier 6.

The resulting control loop is intended to influence the transmission parameters of the transimpedance amplifier 3 and/or of the buffer amplifier 6, ideally in such a way that at the output of the buffer amplifier 6 an identical signal is created for all signal intensities of the voltage pulse trains.

As this ideal case is virtually impossible to achieve, due to the characteristic curve properties of the available components and also due to the limited setting range and the technical offsets of the subcircuits due to the very small operating voltages ranging between 1.8 V and 2.4 V depending on the specification or requirement, this control can only be effective up to an upper photocurrent limit. To avoid interference of nonlinear large signal effects occurring with large signals and based on the knowledge of the protocol definitions of the IrDA standard, the signal path is further influenced by the controls according to the invention as described below.

To avoid any negative effects during the signal transmission, such as abrupt changes of the pulse position and/or of the pulse width of the pulse trains or possibly even erroneous pulses, so-called satellites, which may be caused both by changes of the input signal intensity and by changes of the properties of the signal path by the control process, all control signals if possible, generated in the amplifying control assembly 8 must be produced by graduated, i.e., analog signals.

From the first "AGCSH" control signal obtained from the amplifying control assembly 8 that contains information on the signal intensity and is used to regulate amplification, which, in the present case, means to regulate the transimpedance transconductance in the transimpedance amplifier 3, the analog control signals for the signal limitation "limiter" for the buffer amplifier 6, "short" for the corresponding offset reduction in the high-pass circuit 7, and "level" for influencing the operating threshold and/or the hysteresis of the comparator 4 are obtained in accordance with the invention.

The third "limiter" control voltage is generated in such a way that after reaching the control limit for regulating the transimpedance transconductance of the transimpedance amplifier 3, the limitation of the output signal of the buffer amplifier 6 starts.

Furthermore, according to the invention, there are two additional subassemblies in the circuit assembly: interlocking logic 9 and end control assembly 10. Depending on the "AGCSH" intensity information obtained from the amplifying control assembly 8 during signal transmission and by means of a suitable signal management, these components 9 and 10 generate the digital "zero" and "intense" signals. The "zero" signal controls the recharge of the offset to the capacitors of the high-pass circuit 7, and "intense" controls changes in the time response of the above-described "AGCSH" output signal and thus also of the "limiter, "short", and "level" signals that are dependent on "AGCSH." As a result, this assembly according to the invention makes it possible to minimize the time interval after which the assembly is again able to receive signals at the sensitivity limit, the so-called latency time, following level control of any intensity.

A circuit assembly (not described here) for adjusting the output pulse train provided by the comparator 4 to the pulse requirements of the various IrDA protocols may be connected to the output of comparator 4.

The subcomponents and their functional characteristics are described below.

FIG. 4 shows an exemplary embodiment of a bias voltage generator 2 for generating a negative bias voltage of the photodiode 1. In this generator, the maximum possible bias voltage is generated by a voltage source 11 implemented by a depletion transistor, the operating point of which is set by a stacked current source 12 consisting of two depletion transistors.

The cathode of the photodiode 1 is positioned between the source contact of the voltage source 11 and the drain contact of the current source 12. Using a voltage source 11 at the cathode of the photodiode 1 is advantageous as high operating voltage suppression with regard to the external supply voltage "VDDext" is achieved.

The anode of the photodiode 1 is connected to the connection between the source contact of the current source 12 and, according to the invention, to a grounded shunt connection of a linear resistor 13 and a diode 14. This shunt connection 13, 14 allows a low photocurrent to flow largely unhindered into the input of the transimpedance amplifier 3. This can only be the case if the current divider consisting of resistor 13 of the bias voltage generator 2 and the current in the convergence nodes of the transimpedance amplifier 3 falls in favor of the input current of the transimpedance amplifier 3 via the capacitor 5.

In the case of large photocurrents, wherein the transimpedance amplifier 3 is not able to take in any more due to its level control range, diode 14 ensures that the maximum input voltage of the transimpedance amplifier 3 does not exceed the amount of the diode flux voltage for a large signal. The part solution according to the invention within the bias circuit ensures that, for low photocurrents, in observance of the rule R(13)>>Zin (3), the current divider always falls in favor of the input current.

However, if in the case of a larger photocurrent the flux voltage value of diode 14 is reached, this technique ensures that a negative bias voltage of the photo diode 1 is, nevertheless, maintained. Independently of the size of the photocurrent, the linear component 13 is necessary to allow a maximum negative bias voltage of the photodiode 1 at the sensitivity limit. By redistributing the current division in the case of increasing photocurrent, an increasing portion of the latter is directly diverted to ground and can thus not contribute to an overdrive of the transimpedance amplifier 3.

FIG. 5 shows a more detailed example of the circuit assembly of the transimpedance amplifier 3 as seen in FIG. 3. The latter consists of a differential amplifier 15 whose inverting signal paths respectively are each implemented by a controllable conductance that in the exemplary embodiment are embodied by n-depletion transistors 16. The gates of these n-depletion transistors 16 are connected to the output for the first "AGCSH" control voltage of the amplifying control assembly 8.

In this manner the transformation transconductance is made to follow the current-voltage conversion as a function of intensity. Thus a minimum first "AGCSH" control voltage results in a maximum transconductance of the current-voltage conversion. The sensitivity limit is thus defined. The minimum value of the transformation transconductance obtainable by using n-depletion transistors 16 is reached with the control limit of the first "AGCSH" control voltage.

FIG. 6 shows a useful internal circuit for the differential amplifier 15 seen in FIG. 5. As discussed above, for offset reasons, bipolar transistors 17 embody this amplifier. The requirements for the stability of the collector operating points for the "OUTP" and "OUTN" signals are the result of these n-depletion transistors superimposed on the collector at the source. Therefore, in the practical implementation of the invention, compensation for the temperature coefficient of the basic emitter voltage of the transistors 17 is made by different signs of the temperature coefficients of the load resistors 18, which have a negative temperature coefficient TK1 relative to the resistor 19 determining the current, which has a positive temperature coefficient TK2.

To improve the bandwidth for acceptable operating currents the principle of the feed-forward technique is used in the form of the capacitors 20.

FIGS. 7 and 8 show an exemplary embodiment of the buffer amplifier 6 seen in FIG. 1. The operation amplifier 21 is again implemented as a bipolar differential amplifier according to FIG. 8. Together with the linear elements 22 and 23, this amplifier is applied as a voltage amplifier for differential signals. The capacitors 24 serve to compensate for the differential amplifier input capacity. This serves the purpose of optimizing the current drain at a given upper 3 dB frequency. According to the invention, p-channel transistors 25, whose gates are connected to the analog third "limiter" control voltage generated by the amplifying control assembly 8, are paralleled to the feedback resistors 22, which determine the amplification "V." In this manner, it is possible to influence the amplification and the bandwidth of the buffer amplifier 6 simultaneously and independently of level control.

FIG. 8 shows an embodiment of the operation amplifier 21 seen in FIG. 7. This amplifier, too, is embodied as a bipolar differential amplifier. The output operating point is stabilized in consideration of the input operating point generation for comparator 4 and of the DC coupling to the transimpedance amplifier 3.

The core piece of the circuit assembly shown in FIG. 9 representing the circuit assembly of the high-pass circuit 7, according to the invention, is a symmetrical high pass consisting of the resistors 26 and the capacitors 27.

According to the invention, this high pass is implemented by a voltage divider 28 to average the operating point of the buffer amplifier 6 and of a connection to a tap point between the high-pass resistors 26, by means of which the identical direct voltage signals to the two "OP" and "ON" outputs of the assembly are superimposed on the useful signal in such a way that there is no detrimental influence on the effect of the offset separation.

Furthermore, according to the invention, the contacts of the two capacitors 27 are each connected to the source and the drain contact, respectively, of a p-channel transistor 29 whose gates are controlled by the fourth "short" control voltage also generated in the amplifying control assembly 8. For large input signal amplitudes of the second voltage pulse train, this control signal bridges the capacitors 27 and thus serves the above-described pole reduction of the entire system.

Additionally, the two output nodes "OP" and "ON" of the high-pass circuit 7 in FIG. 9 are each connected to the source and the drain contact, respectively, of an additional p-channel transistor 30 whose gates are controlled by the second "zero" control voltage generated by the end control assembly 10. This transistor's purpose is, upon detection of a packet pause, to reduce the output differential signal of the high-pass circuit 7 to zero for a predefined time so that the comparator 4 connected to it will not detect interference pulses.

Due to the associated drastic reduction of the time constant of the symmetrical high-pass 26, 27, whose resistors 26 are bridged by the resistor 30, a fast recharge of the static offset present at the output of the buffer amplifier 6 to the high-pass capacitors 27 occurs at the same time.

The defined time mentioned is determined adaptively by means of the subcircuits 8, 9, and 10 in FIG. 3 as a function of the amount of the first "AGCSH" control voltage. In this manner, the time processes taking place during the so-called latency time are synchronized with each other.

Comparator 4 is arranged downstream from the high-pass circuit 7. Its operation is shown in FIG. 10. The comparator in its amplifying components is embodied in a circuit technology of prior art. These components are an n-channel input differential amplifier 31 including its current source 32 and load elements 33 and 34, as well as a booster amplifier 35 likewise implemented in a CMOS circuit.

Likewise according to prior art, a switch point shift with regard to the differential input signal at 31 is effected by load elements 33 and 34 by predetermined operating-point currents. The current source 36 leads to a positive shift of the switch point with regard to the differential input signal. At the same time, a current source 37 is used to generate hysteresis of the comparator by impressing directional information onto either the one or the other load element in the same manner by means of a current switch 38 as a function of the digital output signal. For this shift to be defined, the currents from 36 and 37 must be in a fixed relation to the current source 32 of the input differential amplifier 31, the relation being I(36)+I(36)<I (32).

The capacitors 39 are feed-forward capacitors and compensate for the input capacitor of the differential amplifier. The two bipolar transistors 40 limit the maximum output rise of the amplifier 31. Both measures are advantageous for improving the response time of the comparator.

To perform an adaptation of the operating thresholds to the input intensity of the third voltage pulse train according to the invention, currents 36 and 37 are increased as the input intensity increases while the proportionality to the current of the current source 32 must still be maintained. The fifth "level" control voltage as an analog voltage generated by the amplifying control assembly 8 is used as the intensity information.

FIG. 11 shows a circuit assembly according to the invention for generating the currents 32, 36, and 37. The starting point for producing the currents is the bias current "I." First, the letter "I" refers to a current value determined at room temperature. In a simple case, all currents "I" are obtained from a common current bank that provides the currents of the current sources 42, 43, and 44. As particularly the load elements 33, 34 of the comparator subcircuit 41 seen in FIG. 10 exhibit a temperature dependence with regard to the operating point to be adjusted by this circuit, the bias currents for the input differential amplifier 31 and the booster amplifier 35 in the comparator subcircuit may be provided by a thermistor 45 instead of a current source 42. Furthermore, the thermistor must be designed in such a way that a compensation effect results.

To track the operating threshold and the hysteresis of the comparator 4 as a function of intensity according to the invention, the currents of the current sources 36 and 37 are generated from the branch currents in FIG. 11. For this purpose, the currents through transistors 46 and 47 are accumulated to form current 36 and the currents of transistors 48 and 49 are accumulated to form current 37. Transistors 46 and 48 are connected to the current bank that is fed directly by the basic current "I." This interconnection thus defines the threshold shift as well as the hysteresis at the sensitivity limit.

The circuit assembly consisting of the elements 43 and 50 to 54 generates a branch current from the basic current "I" of current source 43 in transistor 55 as a function of the fifth "level" control voltage. As the fifth "level" control voltage rises, an increasing portion of the current flowing in current mirror 50 to current mirror 54 is passed on to the single-mirror transistor 55 that influences the outgoing mirror currents of transistors 47 and 49. If the "level" control voltage is zero at the sensitivity limit, no current will be conducted into current mirror 54 and comparator 4 will possesses the operating threshold and hysteresis defined by the currents flowing in transistors 46 and 48.

There is an upper switching threshold "UTHO" and a lower switching threshold "UTHU" resulting from the operating threshold and hysteresis. Reference voltage "VREF" in FIG. 11 defines the point where 50% of the current "I" is directed into current mirror 54. The "VREF" voltage is generated by the voltage divider 51 from a stabilized supply voltage "VDDa". The maximum value is reached when 100% of the current "I" is directed into the current mirror 54. The amount of the maximum shift of the operating threshold and hysteresis depends on the chosen current-mirror ratios of transistors 47 to 55 and 49 to 55.

Transistor 104 operates as a single mirror transistor of a current mirror for the current alternatively selectable via elements 42 and 45. Outgoing mirror transistor 105 is used to generate the current 32 for the comparator subcircuit 41.

FIG. 12 shows the impact of the circuit assembly according to the invention on the upper and/or lower switching threshold "UTHO" and/or "UTHU" as a function of the fifth "level" control voltage.

The output signal of the DC-coupled buffer amplifier 6 in the signal path of FIG. 3 is connected to the inputs INP and INN of the amplifying control assembly 8. FIG. 13 shows the circuit assembly according to the invention for generating the analog "AGCSH", "level", "limiter", and "short" control voltages. Furthermore, the amplifying control assembly 8 is supplied with the digital "time" and "intense" control signals generated in the interlocking logic 9 and the end control assembly 10.

The input part of the circuit assembly comprises a CMOS-HF amplifier 59 with the two coupling capacitors 60 used as a differential former by means of elements 57 and 58. As the input elements exhibit high-pass behavior for the offset separation of the buffer amplifier 6, the operating point at the input of the amplifier 59 is formed by means of the elements 61, 62, and 63 and directed to the junction summing point via resistors 64.

The voltage source 65, which may in practice be obtained, for example, from the stabilized voltage "VDDa" by means of a voltage divider, raises the output operation point of the amplifier 59 by a small amount and thus ensures high-frequency suitability of the assembly up to the lower control limit by already putting the amplifier 59 into an active range. In the practical application of the invention, the value of the voltage source 65 is 50 mV, for example, in order to achieve a compromise between HF-suitability on the one hand and acceptable restriction of the level-controllability on the other hand.

The purpose of this input circuit of the amplifying control assembly 8 is to form a single-ended signal out of the input differential signal that is grounded and transmits only the positive half-wave of the input differential signal:

$$V\text{out}p\ (59) = |k^*(V(INP) - V(INN))| + V(65)$$

wherein $k = R(58)/R(57)$ balances the damping factor of the limiter $1/k$.

This is the only measure for the light intensity at the input or for the current supplied to the overall circuit of FIG. 3 by the photodiode 1. The amplification fixed by the resistance ratio 58 to 57 is >1 and dimensioned in such a way that the positive control limit of the first "AGCSH" control voltage is achieved even if the limitation of the output signal of the buffer amplifier 6 is activated by means of the third "limiter" control voltage. That output signal in turn is used as an input signal for the amplifying control assembly 8 shown in FIG. 13. To avoid an erroneous voltage on the "AGCSH" signal due to offset, this offset is eliminated using the elements 66 and 67. According to the invention, the transistor 67 that belongs to the high pass and operates as a conductance is not embodied as a linear resistor but exhibits the characteristic of transmitting the pulses produced by amplifier 59 nearly without any loss for voltages of VINP(68)>0V since the transistor 67 in this case is inverse and therefore high ohmic.

Thus the following applies to the charge Q on capacitor 66 after each pulse:

$$Q(66) = 0.$$

Transistor 67 opens precisely at the point when the emitter voltage of 67 falls below the "zero voltage limit" due to the basic relation to the bipolar flux voltage from transistor 62.

Thus, the solution according to the invention ensures that despite offset separation the pulses are transmitted with the full amplitude to the subsequent sample-and-hold circuit.

The following rail-to-rail operation amplifier 68 is fully adjustable between "VSS" and "VDDa" at the input and the output. It implements a sample-and-hold-type function together with at least the current source 69 and the low-pass capacitor 70 of the low pass comprising resistor 71 and capacitor 70. Thus a first "AGCSH" control voltage is available at the output of the low pass 70, 71, and this voltage corresponds on average to the peak value of the pulses provided by the operation amplifier 59.

The negators 107 and 108 adjust the polarity of the corresponding control signals.

FIG. 14 shows an exemplary embodiment of the rail-to-rail operation amplifier 68. It comprises a combination of p-channel differential amplifier 72 with the associated load element 73 and the n-channel differential amplifier 74 with the load element 75. Both differential amplifiers are connected to each other at their inputs and form the joint inputs "INP" and "INN" of the operation amplifier 68. The support of the application of 68 according to the invention is effected by the output design. To achieve the sample-and-hold character, the output of 68 must drive the output voltage in a positive direction only. To ensure the fastest sampling possible, an n-channel source follower 76 becomes active in the lower part of the output level control range, and this source follower 76 is driven from the p-channel differential amplifier 72, the latter allowing for level control in the lower range also at the input. The upper part of the level control range is implemented at the output by a p-channel transistor 77, which is controlled by n-channel differential amplifier 74.

In the application according to the invention of the circuit in FIG. 14, its output is connected to the current source 69 or the shunt connection of sources 69 and 78 to ground "VSS," as shown in FIG. 13. Due to the characteristics of operation amplifier 68, the sampling capacitor 70 may, on the one hand, be quickly charged to the current peak value of the pulses at the input of the operation amplifier 68, and on the other hand, there is a selectively controllable discharge of capacitor 70 by means of the current source 69 possible. This functionality of quickly charging the sampling capacitor 70 during the photocurrent pulse duration and its very slow discharge during the pulse pauses allows the overall circuit assembly as shown in FIG. 3 to tolerate minor intensity changes during data transmissions. The current of current source 78 is utilized during the end processing after each data transmission, in that the signal management described below opens the analog switch 79 during the end processing and thus accelerates the discharge of capacitor 70 by this additional current.

When the first "AGCSH" control voltage rises, it causes an amplitude reduction of the output signal at the buffer amplifier 6 in the control loop as seen in FIG. 3 by reducing the transconductance of the transimpedance amplifier 3. This poses the risk of the transmission potentially being disrupted. Therefore, the first "AGCSH" control voltage must be able to adjust gradually to the input intensity of the photocurrent pulses with a defined time constant. For this purpose the resistor 71 in FIG. 13 is placed between the output of the rail-to-rail operation amplifier 68 and the sampling capacitor 70.

The "AGCSH" signal of the assembly is the central control signal for the amplitude control and is supplied at the "AGCSH" output of the assembly. While the third "limiter" control voltage exerts regulating as well as controlling influences on the behavior of the assembly according to the invention, all other output signals of the amplifying control assembly 8 have a control signal character. According to the invention, all other control voltages are derived from the first "AGCSH" control voltage.

The fifth "level" control voltage used for the adaptive control of the comparator switching thresholds results from the further smoothing of the "AGCSH" voltage by means of a low pass consisting of a resistor 80 and a capacitor 81 and of a voltage amplification by a factor>1 in the operation amplifier 84 implemented by the resistors 82 and the capacitor 83. The amplification must be >1 so that after a data transmission, when the "AGCSH" control voltage is already decreasing, the comparator thresholds can be kept at the value fixed for the transmission, thus increasing the interference resistance by means of capacitor 70. Here, deliberate use is made of the upper control limit of the operation amplifier 84. In the practical implementation of the invention, a voltage amplification value of 2 is appropriate. Accordingly, with "AGCSH" control voltage values above half the operating voltage "VDDa," the feedback of the comparator thresholds starts only when the "AGCSH" control voltage has already decreased to 50%.

At the same time, the dominant pole of the operation amplifier 84 according to prior art and the capacitor 83 contained in the application are used to further smooth the fifth "level" control voltage. This is necessary to keep the comparator thresholds and thus the pulse position at a stable level with regard to the sampling by the comparator 4 once the signal intensity has been determined. This means a reduction of the jitter with respect to the falling flank of the output signal "OUTN" of comparator 4 in FIG. 3.

According to the invention, the third "limiter" control voltage is generated to reduce the amplification of buffer amplifier 6 as a function of the amplitude in the case of high input intensity. That is, a peak value limitation and a reduction of the static amplification of buffer amplifier 6 are carried out. At the same time, this reduces offset amplification for high signal intensities and thus advantageously influences the behavior of the circuit. The input signal of the generation circuit for the third "limiter" control voltage consisting of a voltage source 85 and the transistors 86 and 87 is taken from a low pass of the second order consisting of the elements 71, 80, 70, and 81 and is supplied to the interconnected gates of the p-channel transistor 87 and the n-channel transistor 86. A direct voltage source 85 is connected to the source contact of the transistor 86.

This voltage source 85 determines the level of the output differential signal of the buffer amplifier 6 above which a limitation takes place. The value of the voltage source 85 depends on the operating point of the outputs "OP" and "ON" of the buffer amplifier 6 and on the threshold voltage of the p-channel transistors 25 that are used for limitation. It should be noted for dimensioning the voltage source 85 that the p-channel threshold voltage increases by contacting its bulk contacts to "VDDs" due to the substrate control factor of the transistors 25. In the practical implementation of the invention, the voltage of the voltage source 85 can be generated in various ways.

As a constant voltage from the stabilized supply voltage "VDDa" using an ohmic voltage divider or adaptively using the circuit assembly in FIG. 15.

In an implementation according to FIG. 15, the averaged operating point contact "CM" of the outputs of the buffer amplifier 6 in the high-pass circuit 7 shown in FIG. 9 is used. This contact is denoted as "CM" in both subcircuits, FIG. 9 and FIG. 15. Depending on the precision requirements regarding pulse position and acceptable jitter, the connected gates of the transistors 86 and 87 are either connected by the "AGCSH" signal shown in FIG. 13 in the case of high precision requirements or by the "AGCSH" control voltage saving the second low pass in the case of low precision requirements.

The statically unloadable output signal "CM" shown in FIG. 9 is decoupled using the electrometer amplifier 88 and supplied to a level-shift stage 89, 90, with the p-channel transistor 89 having the same dimensioning and the same operating point as the transistors 25 as seen in FIG. 7. The limiter voltage can be adjusted using the voltage divider 91. The voltage thus obtained at the output of the voltage divider 91 replaces the constant voltage 85 as shown in FIG. 13.

Conveniently, the two resistors 86 and 87 are dimensioned in such a way that cross-fading and thus the activation of the limiter circuit starts at the center of the level control range defined by "VDDa." This threshold is necessary to ensure reliable blocking of the limiter transistors 25 in the case of low photocurrents and thus full amplification of the buffer amplifier 6.

According to the invention, the fourth "short" control voltage serves as pole reduction by bridging the capacitors 27 shown in FIG. 9. As the actuator elements 29 provided for this purpose are implemented by p-channel transistors on the basis of the voltage ratio regarding the operating point and the threshold voltages, this signal must be negative relative to the first "AGCSH" control voltage. A simple solution is the inverter implemented by means of the n-channel transistor 92 and the ohmic load element 93. A particularly advantageous effect is achieved by the fact that the reverse process only commences when the n-channel threshold voltage of transistor 92 is reached. Accordingly, bridging the offset separation starts only in the case of medium photocurrents where the differential amplitude at the comparator 4 is already large enough for the static offset occurring at the output of the buffer amplifier 6 not to matter anymore. This is furthermore accompanied by the start of the shift of the thresholds of comparator 4.

A p-channel switch transistor 94 is paralleled with the load element 93, allowing feedback of the high-pass circuit 7 into the offset separation mode following the end of a data transmission by quickly blocking the transistors 29 that serve for bridging the high-pass circuit 7 in the case of a fast-rising fourth "short" control voltage. This process is triggered by the signal management according to the invention using the "time" signal that is generated in the interlocking logic 9 as seen in FIG. 3 using the circuit design shown in FIG. 16.

Furthermore, according to the invention, the "time" signal, gated with the "intense" signal in the NAND gate 95, is used to switch on the current source 78 shown in FIG. 13 to more quickly discharge the "AGCSH" capacitor 70. The fast reactivation of the offset separation circuit as well as the fast feedback of the first "AGCSH" control voltage make it possible to reduce the time interval following each data transmission of any intensity until the receiver is again able to receive signals at the sensitivity limit; this time interval is referred to in the IrDA standard as latency time.

The circuit shown in FIG. 16 according to the invention serves to detect an ongoing data transmission or to detect a packet pause. This packet pause of a transmission occurs exactly at the time when, after a low-high flank at the output of the comparator 4, the defined time period in timer 96 has elapsed and no further rising of the flank occurs at the output of comparator 4.

The digital differentiation 97 seen in FIG. 16 that is connected upstream is described in detail in FIG. 17.

This assembly causes a differentiation of the positive comparator signal "comp" obtained, for example, from the output "OUTP" of comparator 4 and provides for equal treatment of pulses of different widths generated at the comparator output.

The time comparison with the predetermined time period starts anew at the beginning of each light pulse. The time period is dimensioned, using the current of the current source 98 or the capacitor 99 shown in FIG. 18, in such a way that, for the slowest protocol supported, SIR/9.6 kBit/s, where a maximum pulse width of 22 μs may occur, the following applies:

Time period>22 μs and time period<tlatency time−tzero.

In this regard, "tlatency time" is a product characteristic to be defined and which the IrDA standard divides into various classes. According to the classification, the target minimum value for the latency time should be <50 μs in the best class for an effective protocol transmission. The maximum time for discharging the "AGCSH" capacitor 70 from any given maximum value, i.e., also the one defined by "VDDa," down to a lower threshold value indicated by a high-low flank of the "intense" signal of the end control assembly 10 shown in FIG. 3, is denoted "tzero" and has to be taken into consideration when dimensioning the time period.

The time period thus defined causes each pulse in a transfer of 9.6 kBit/s, including pulses with a pulse duration of 22 μs, to be detected as single pulses and the signal management of the end processing according to the invention to become effective after each of these pulses. With pulses that long, there is the great danger that, in the case of a high energy content of the pulses, a static offset of the entire amplifier assembly located in the signal path causes an overshoot at the input of the comparator 4 and thus probably a detrimental erroneous pulse. In the faster mode, the end processing management is in each case activated only during longer transmission pauses. This is particularly advantageous for modes such as FIR (4 Mbit/s) and VFIR (16 Mbit/s), so that as many control voltages as possible are essentially constant during the data transmission and thus the jitter of the comparator's output pulses is kept to a minimum. For any changes in the amplifier properties that are affected by these control voltages also result in a change in the time position of the voltage pulse trains at the amplifier output.

The "lock" signal derived from the inverted output of the static master-slave flip-flop 100 shown in FIG. 16 serves as a flag for an ongoing transmission. That is, an ongoing transmission is displayed by a low level at "lock." Upon the expiry of the time set by the timer 96, i.e., if no pulse is detected during the time period, the "lock" flag turns to High and marks the end of the transmission for the associated end control assembly 10 shown in FIG. 3. This prevents an erroneous start of an end processing according to the end processing procedure according to the invention while a data transmission is in progress. The negators 109 and 110 adjust the signal levels to the logic states required for control.

The time difference between the high-low flanks of the two "time" and "lock" output signals of the assembly shown in FIG. 16 that is marked by means of the D-flip-flop 100 can be used in an expanded circuit assembly for subjecting each first pulse of every transmission to a special processing procedure, for example all pulses in the SIR 9 kBit/s-mode.

The assembly of the end control assembly 10 shown in FIG. 3 generates the "intense" and "zero" signals according to the invention and is shown in FIG. 19. While the "intense" signal is used to influence the current source 78 in the amplifying control assembly 8, the "zero" signal influences the high-pass circuit 7.

The "intense" signal ensures that the fast discharge of the "AGCSH" capacitor 70 triggered by the timer during the end processing is performed only down to a minimum value defined by the "VREF" reference voltage as seen in FIG. 19.

This is necessary because, on the one hand, any change of the "AGCSH" control voltage will be interpreted as a signal by the transimpedance amplifier 3, and, on the other hand, the value of the "AGCSH" control voltage should correspond to the value of 1,1 * idfmin defined by the IrDA standard (idfmin: photocurrent at the sensitivity limit).

During the fast discharge process of capacitor 70, i.e., when the end detection has been released by the "lock" signal, a low level is produced at the "zero" signal. This low level opens the p-channel transistor 30 in the high-pass circuit 7 shown in FIG. 9 and drastically reduces the time constant for recharging the amplifier offset voltage to capacitors 27. At the same time, this prevents that during the fast discharge phase of the "AGCSH" control voltage any undesired output voltage changes are detected by the comparator 4 at the output of the buffer amplifier 6.

The described control voltages are generated in a process where, following the detection of a packet end, the "lock" signal is interpreted as a pulse at the flip-flop 101 which then supplies a low level at the "zero" output. The completion of the fast discharge phase of capacitor 70 and the clamping of the comparator input is indicated as a low level at the "intense" output. The latter resets the flip-flop 101 and regenerates a high level at the "zero" output.

The "intense" signal is formed using the comparator 102 by comparing the current value of the "AGCSH" control voltage at the "AGCSH" contact of the comparator 4 to the "VREF" reference voltage provided by the voltage divider 103 from the stabilized "VDDa" operating voltage.

FIGS. 20 to 22 show typical signal paths of the signals that are important for the solution according to the invention. While FIG. 20 shows an overview of the overall time range of a FIR pattern with 3 preambles and a part of the subsequent start flag, FIG. 21 shows the signal courses during the first pulses of the preamble. The figure clearly shows how, as the control voltage increases, the pulse amplitude at "vdout" is continuously reduced due to the regulating effects and how it is limited to a constant value after "limiter" has taken effect. The right-hand part of the figure shows the paths of the signals of the time management.

The effect of the signal management, according to the invention, during the end processing is shown in FIG. 22. It can be seen in the figure that the value of the offset voltage is applied at the "vdout" output of the high-pass circuit 7. During this phase the comparator threshold is at the maximum capacity, as becomes apparent from the "level" signal at the center part of the figure. With "zero," "vdout" becomes zero and then, after a low and uncritical switch offset, returns to the zero value very quickly.

Method and Assembly for Converting a Received Optical Pulse Train into an Electric Output Pulse Train

LIST OF REFERENCE NUMERALS 1 photodiode
2 bias voltage generator
3 transimpedance amplifier
4 comparator
5 capacitor
6 buffer amplifier
7 high-pass circuit
8 amplifying control assembly
9 interlocking logic
10 end control assembly
11 voltage source 12 current source
13 linear resistor
14 diode
15 differential amplifier
16 n-depletion transistor
17 bipolar transistor
18 load resistor
19 resistor
20 capacitor
21 operation amplifier
22 linear element
23 linear element
24 capacitors
25 p-channel transistors
26 high-pass resistor
27 high-pass capacitor
28 voltage divider
29 p-channel transistor
30 p-channel transistor
31 input differential amplifier
32 current source
33 load element
34 load element
35 booster amplifier
36 current source
37 current source
38 current switch
39 capacitors
40 bipolar transistor
41 comparator subcircuit
42 current source
43 current source
44 current source
45 thermistor
46 transistor
47 transistor
48 transistor
49 transistor
50 current mirror
51 voltage divider
52 transistor
53 resistor
54 current mirror
55 transistor
56 "VREF" reference voltage
57 resistor
58 resistor
59 CMOS-HF amplifier
60 capacitor
61 current source
62 transistor
63 transistor
64 resistors
65 voltage source
66 capacitor
67 transistor
68 operation amplifier
69 current source
70 capacitor
71 resistor
72 p-channel differential amplifier
73 load element
74 n-channel differential amplifier
75 load element
76 n-channel source follower
77 p-channel transistor
78 current source
79 analog switch
80 resistor
81 capacitor
82 resistor
83 capacitor
84 operation amplifier
85 voltage source
86 n-channel transistor
87 p-channel transistor
88 electrometer amplifier
89 p-channel transistor
90 resistor
91 voltage divider
92 n-channel transistor
93 ohmic load element
94 p-channel switch transistor
95 NAND gate
96 timer
97 digital differentiation
98 current source
99 capacitor
100 flip-flop
101 flip-flop
102 comparator
103 voltage divider
104 transistor
105 transistor
106 transistor
107 negator
108 negator
109 negator
110 negator

The invention claimed is:

1. A method for converting a received optical pulse train received using an IrDA receiver into an electric output pulse train, wherein the received optical pulse train has pulse packets and packet pauses and wherein the received optical pulse train is converted into a light-dependent current pulse train that is transformed into a voltage pulse train whose amplitude is regulated and whose pulses are transformed into digital output pulses of the output pulse train, the method comprising;

transforming the current pulse train into a first voltage pulse train in a controlled manner;

transforming the first voltage pulse train into a second voltage pulse train by controllably limiting an amplitude of the first voltage pulse train to result in the second voltage pulse train;

generating a third voltage pulse train as a function of the amplitude of said second voltage pulse train such that said third voltage train is free of a static offset of said second voltage pulse train if the second voltage pulse train is below a first amplitude threshold, said third voltage pulse train is free of said static offset to a reduced degree if the second voltage pulse train is above the first amplitude threshold, the reduced degree being reduced relative to an amount of static offset if the second voltage pulse train is below the first amplitude threshold;

generating said third voltage pulse train free of a dynamic offset, if the third pulse train is above a second amplitude threshold that is above said first amplitude threshold, and generating said third voltage pulse train with only a reduced degree of said dynamic offset of said second voltage pulse train, if the third pulse train is below said second amplitude threshold wherein at the occurrence of a packet pause the amplitude of said third voltage pulse train is set to zero; and the output pulse train is generated from the third voltage pulse train.

2. The method according to claim 1, wherein all electrical pulse trains between the current pulse train and the third voltage pulse train are differential signal pulse trains.

3. The method according to claim 1, wherein a dynamic offset separation is carried out for producing the third voltage pulse train, the second voltage pulse train is subjected to high-pass filtering using a capacitor and in each pulse pause a discharge of the capacitor by an amount that is a function of the size of the amplitude of the second voltage pulse train is performed.

4. The method according to claim 1, wherein each pulse of the output pulse train starts a time comparison with a pre-defined time period, wherein after a lapse of the predefined time period, a lock signal is generated marking the end of a pulse packet.

5. The method according to claim 4, wherein the time period is shorter than a latency time and longer than a longest occurring pulse pause.

6. The method according to claim 1, wherein a first AGCSH control voltage is generated as a function of the amplitude of the second voltage pulse train for controlling the amplitude of the first voltage pulse train that is generated in the transformation of the current pulse train into a voltage pulse train.

7. The method according to claim 6, wherein a second control voltage is generated as a function of the first AGCSH control voltage to set the amplitude of the third voltage pulse train to zero at the occurrence of a packet pause if the amplitude of the second voltage pulse train exceeds the first amplitude threshold and a lock signal is active.

8. The method according to claim 6 wherein a second control voltage is generated as a function of the first AGCSH control voltage and used to limit the amplitude of the second voltage pulse train.

9. The method according to claim 6 wherein a second control voltage is generated as a function of the first AGCSH control voltage and used to generate the third voltage pulse train that is free of the static or the dynamic offset.

10. The method according to claim 6 wherein a second control voltage is generated as a function of the first AGCSH control voltage and used to control the operating threshold and the hysteresis of a comparator during the generation of the output pulse train from the third voltage pulse train.

11. The method according to claim 7 wherein a third control voltage is generated as a function of the first AGCSH control voltage and used to limit the amplitude of the second voltage pulse train.

12. The method according to claim 7 wherein a third control voltage is generated as a function of the first AGCSH control voltage and used to generate said third voltage pulse train that is free of the static or the dynamic offset.

13. The method according to claim 8 wherein a third control voltage is generated as a function of the first AGCSH control voltage and used to generate said third voltage pulse train that is free of the static or the dynamic offset.

14. The method according to claim 11 wherein a fourth control voltage is generated as a function of the first AGCSH control voltage and used to generate said third voltage pulse train that is free of the static or the dynamic offset.

15. An assembly for converting an optical received pulse train into an electric output pulse train, the assembly comprising a bias voltage generator connected to a photodiode, a two input transimpedance amplifier connected at its inputs to said photodiode, and a comparator arranged downstream from said input transimpedance amplifier, wherein the comparator has an output for supplying the output pulse train, wherein each of the photodiode's electrodes is connected to one of the inputs of the transimpedance amplifier via a capacitor, the output of said transimpedance amplifier is connected to the input of a buffer amplifier, the output of said buffer amplifier is connected to the input of a comparator via a high-pass circuit and wherein a capacitor of said high-pass circuit is bridged by a controllable element, the input of an amplifying control assembly that controls the amplification of said transimpedance amplifier is connected to the output of said buffer amplifier, and the output of said amplifier control assembly is connected to a control signal input of said transimpedance amplifier.

16. The assembly according to claim 15, wherein connections between each of the transimpedance amplifier and the buffer amplifier, the buffer amplifier and the high-pass circuit, and the high-pass circuit and comparator comprise two signal paths for transmitting differential signals.

17. The assembly according to claim 16,
wherein the high-pass circuit has two inputs, with one input IN connected to a first contact of a first capacitor and one input IP connected to a first contact of a second capacitor,
wherein a second contact of the first capacitor is connected to an output ON of the high-pass circuit and a second contact of the second capacitor is connected to an output OP of the high-pass circuit,
wherein a first voltage divider is provided between the input IN and the input IP of the high-pass circuit and a second voltage divider is provided between the output ON and the output OP of the high-pass circuit, whose center taps are each connected to each other, the first and the second capacitors are each bridged by a source-drain structure of a MOS-FET as a respective controllable element, and the gate contacts of the two transistors are connected to a first input of the high-pass circuit, the outputs ON and OP are each connected to a contact of a source-drain structure of a third MOS-FET whose gate contact is connected to a second input of the high-pass circuit.

18. The assembly according to claim 15, wherein an output of the comparator is connected to the input of an interlocking logic that signals a pulse packet end, and a first output of the interlocking logic is connected to a second input of the amplifying control assembly.

19. The assembly according to claim 18 further comprising a second output of the interlocking logic connected to a first input of an end control assembly, a second input of the end control assembly is connected to the output of the amplifying control assembly, and a first output of the end control assembly is connected to a second input of the high-pass circuit.

20. The assembly according to claim 19, further comprising a second output of the end control assembly connected to a third input of the amplifying control assembly.

* * * * *

UNITED STATES PATENT AND TRADEMARK OFFICE
CERTIFICATE OF CORRECTION

PATENT NO.        : 7,536,114 B2
APPLICATION NO.   : 11/405023
DATED             : May 19, 2009
INVENTOR(S)       : Gieseler et al.

It is certified that error appears in the above-identified patent and that said Letters Patent is hereby corrected as shown below:

Claim 15, Col. 24, Line 6: Delete "from said input" and insert -- from said two input --

Signed and Sealed this

First Day of September, 2009

David J. Kappos
*Director of the United States Patent and Trademark Office*